US012633895B2

(12) United States Patent
Konaka

(10) Patent No.: US 12,633,895 B2
(45) Date of Patent: May 19, 2026

(54) ACOUSTIC WAVE ELEMENT, ACOUSTIC WAVE FILTER DEVICE, AND MULTIPLEXER

(71) Applicant: Murata Manufacturing Co., Ltd., Nagaokakyo (JP)

(72) Inventor: Yohei Konaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 177 days.

(21) Appl. No.: 18/401,756

(22) Filed: Jan. 2, 2024

(65) Prior Publication Data

US 2024/0137002 A1 Apr. 25, 2024
US 2024/0235523 A9 Jul. 11, 2024

Related U.S. Application Data

(63) Continuation of application No. PCT/JP2022/026979, filed on Jul. 7, 2022.

(30) Foreign Application Priority Data

Jul. 8, 2021 (JP) ................................. 2021-113672

(51) Int. Cl.
H03H 9/13 (2006.01)
H03H 9/17 (2006.01)
H03H 9/56 (2006.01)

(52) U.S. Cl.
CPC ............ H03H 9/133 (2013.01); H03H 9/132 (2013.01); H03H 9/17 (2013.01); H03H 9/568 (2013.01)

(58) Field of Classification Search
CPC .......... H03H 9/133; H03H 9/132; H03H 9/17; H03H 9/568; H03H 9/14576; H03H 9/6483; H03H 9/725

(Continued)

(56) References Cited

U.S. PATENT DOCUMENTS

2013/0285768 A1* 10/2013 Watanabe .............. H10N 30/01
333/193
2017/0222624 A1 8/2017 Kishino
(Continued)

FOREIGN PATENT DOCUMENTS

WO 2016017730 A1 2/2016
WO 2018168836 A1 9/2018
(Continued)

OTHER PUBLICATIONS

International Search Report in PCT/JP2022/026979, mailed Aug. 30, 2022, 3 pages.

(Continued)

*Primary Examiner* — Jorge L Salazar, Jr.
(74) *Attorney, Agent, or Firm* — Keating & Bennett, LLP

(57) ABSTRACT

In an acoustic wave element, a distance between a comb electrode finger closest to a reflector and a reflective electrode finger closest to an interdigital transducer (IDT) electrode is set as an IDT-reflector gap. An inter-center distance between adjacent electrode fingers is set as a pitch. The electrode fingers in a direction from the comb electrode finger closest to the reflector toward a center are sequentially set as an n-th end-side electrode finger, and a pitch between the n-th end-side electrode finger and an (n+1)-th end-side electrode finger is set as an n-th end-side pitch. An average value of each pitch by all the comb electrode fingers is set as an average IDT pitch, and an average value of each pitch by the reflective electrode fingers is set as an average reflector pitch.

17 Claims, 19 Drawing Sheets

(58) Field of Classification Search
USPC ................................................... 333/193–196
See application file for complete search history.

(56)                    References Cited

U.S. PATENT DOCUMENTS

| | | |
|---|---|---|
| 2020/0007110 A1 | 1/2020 | Konaka et al. |
| 2020/0304102 A1 | 9/2020 | Kanazawa |
| 2021/0152153 A1 | 5/2021 | Kishino |

FOREIGN PATENT DOCUMENTS

| | | |
|---|---|---|
| WO | 2019117133 A1 | 6/2019 |
| WO | 2019198594 A1 | 10/2019 |

OTHER PUBLICATIONS

Written Opinion in PCT/JP2022/026979, mailed Aug. 30, 2022, 4 pages.

* cited by examiner

IDT-
REFLECTOR
GAP
=0.80P_REF

IDT-
REFLECTOR
GAP
=0.84P_REF

IDT-
REFLECTOR
GAP
=0.88P_REF

IDT-
REFLECTOR
GAP
=0.92P_REF

IDT-
REFLECTOR
GAP
=1.12P_REF

IDT-
REFLECTOR
GAP
=1.16P_REF

IDT-
REFLECTOR
GAP
=1.20P_REF

IDT-
REFLECTOR
GAP
=1.24P_REF

FIG. 9

| COMPARATIVE EXAMPLE 1 | REFLECTOR WAVELENGTH | AMOUNT OF DETERIORATION [dB] FOR 5 MHz |
|---|---|---|
| a | $1.030\lambda_{IDT}$ | 1.79 |
| b | $1.032\lambda_{IDT}$ | 1.54 |
| c | $1.034\lambda_{IDT}$ | 1.32 |
| d | $1.036\lambda_{IDT}$ | 1.14 |
| e | $1.038\lambda_{IDT}$ | 1.31 |
| f | $1.040\lambda_{IDT}$ | 1.80 |
| g | $1.042\lambda_{IDT}$ | 2.34 |
| h | $1.044\lambda_{IDT}$ | 2.91 |
| i | $1.046\lambda_{IDT}$ | 3.50 |
| j | $1.048\lambda_{IDT}$ | 4.05 |

FIG. 10

| AMOUNT OF DETERIORATION [dB] FOR 5 MHz | RATIO OF EIGHTH END-SIDE PITCH TO AVERAGE IDT PITCH | | | | | | | | | | | | | |
|---|---|---|---|---|---|---|---|---|---|---|---|---|---|---|
| | 0.74 | 0.76 | 0.78 | 0.8 | 0.82 | 0.84 | 0.86 | 0.88 | 0.9 | 0.92 | 0.94 | 0.96 | 0.98 | 1 |
| RATIO OF IDT-REFLECTOR GAP TO AVERAGE REFLECTOR PITCH 0.80 | 6.53 | 6.05 | 5.89 | 5.32 | 4.71 | 4.41 | 6.71 | 12.35 | 21.79 | 9.73 | 4.09 | 1.34 | 1.38 | 1.70 |
| 0.82 | 6.72 | 6.18 | 5.41 | 4.96 | 4.51 | 5.06 | 8.91 | 18.31 | 13.63 | 5.46 | 1.84 | 0.87 | 0.97 | 1.19 |
| 0.84 | 6.55 | 6.14 | 5.52 | 4.83 | 4.13 | 6.36 | 12.09 | 25.68 | 8.18 | 3.11 | 0.70 | 0.56 | 0.69 | 2.07 |
| 0.86 | 6.45 | 5.94 | 5.28 | 4.55 | 4.37 | 7.91 | 16.24 | 12.64 | 5.40 | 1.55 | 0.32 | 0.44 | 1.50 | 3.33 |
| 0.88 | 6.51 | 5.82 | 5.02 | 4.15 | 5.22 | 9.87 | 24.55 | 9.40 | 3.41 | 0.71 | 0.26 | 0.74 | 2.46 | 4.70 |
| 0.90 | 6.62 | 5.77 | 4.84 | 3.82 | 6.23 | 12.05 | 18.52 | 6.60 | 2.14 | 0.26 | 0.21 | 1.41 | 3.29 | 5.73 |
| 0.92 | 6.58 | 5.70 | 4.73 | 3.93 | 7.40 | 15.78 | 12.77 | 4.86 | 1.27 | 0.10 | 0.55 | 2.10 | 4.47 | 7.23 |
| 0.94 | 6.14 | 5.47 | 4.61 | 4.53 | 8.55 | 22.16 | 10.66 | 3.56 | 0.67 | 0.07 | 0.93 | 2.87 | 5.36 | 8.38 |
| 0.96 | 6.38 | 5.13 | 4.39 | 5.15 | 10.29 | 21.72 | 7.59 | 2.47 | 0.32 | 0.21 | 1.44 | 3.57 | 6.17 | 9.48 |
| 0.98 | 6.29 | 5.33 | 4.00 | 5.89 | 12.10 | 17.53 | 6.29 | 1.67 | 0.13 | 0.43 | 1.97 | 4.24 | 7.05 | 10.56 |
| 1.00 | 6.09 | 5.07 | 4.09 | 6.72 | 13.58 | 15.16 | 4.98 | 1.15 | 0.06 | 0.70 | 2.49 | 4.95 | 8.00 | 11.23 |
| 1.02 | 6.18 | 5.00 | 3.96 | 7.63 | 17.35 | 11.88 | 3.83 | 0.73 | 0.08 | 1.02 | 2.99 | 5.66 | 8.80 | 10.95 |
| 1.04 | 5.94 | 4.93 | 4.35 | 8.64 | 23.79 | 9.41 | 2.92 | 0.43 | 0.16 | 1.38 | 3.43 | 6.22 | 9.02 | 13.18 |
| 1.06 | 5.97 | 4.74 | 4.85 | 9.77 | 38.15 | 7.60 | 2.22 | 0.23 | 0.31 | 1.76 | 3.80 | 6.43 | 9.88 | 13.49 |
| 1.08 | 5.89 | 4.72 | 5.40 | 11.06 | 22.60 | 6.23 | 1.66 | 0.11 | 0.50 | 2.12 | 4.48 | 7.35 | 10.89 | 14.04 |
| 1.10 | 5.65 | 4.55 | 6.02 | 12.55 | 17.06 | 5.13 | 1.22 | 0.13 | 0.72 | 2.41 | 5.01 | 7.98 | 10.34 | 15.24 |
| 1.12 | 5.81 | 4.47 | 6.70 | 14.28 | 13.72 | 4.22 | 0.86 | 0.16 | 0.94 | 2.83 | 5.19 | 7.94 | 12.22 | 15.24 |
| 1.14 | 5.33 | 4.39 | 7.48 | 16.20 | 11.31 | 3.45 | 0.58 | 0.19 | 1.17 | 3.31 | 5.90 | 9.12 | 11.28 | 16.14 |
| 1.16 | 5.61 | 4.22 | 8.39 | 17.89 | 9.42 | 2.79 | 0.36 | 0.22 | 1.50 | 3.60 | 6.35 | 8.88 | 13.40 | 17.19 |
| 1.18 | 5.42 | 4.69 | 9.46 | 18.22 | 7.85 | 2.20 | 0.20 | 0.34 | 1.82 | 3.96 | 6.54 | 10.10 | 11.97 | 15.75 |
| 1.20 | 5.25 | 5.22 | 10.76 | 16.66 | 6.52 | 1.69 | 0.12 | 0.51 | 2.05 | 4.50 | 7.34 | 9.86 | 14.51 | 19.39 |
| 1.22 | 5.36 | 5.84 | 12.44 | 14.30 | 5.38 | 1.25 | 0.13 | 0.68 | 2.41 | 4.66 | 7.14 | 11.05 | 13.36 | 15.95 |
| 1.24 | 4.91 | 6.59 | 14.76 | 11.97 | 4.38 | 0.88 | 0.14 | 0.90 | 2.81 | 5.23 | 8.22 | 10.63 | 15.24 | 19.47 |
| 1.26 | 5.13 | 7.49 | 18.39 | 10.24 | 3.51 | 0.58 | 0.15 | 1.18 | 3.07 | 5.65 | 8.15 | 12.03 | 15.06 | 19.66 |
| 1.28 | 4.92 | 8.62 | 26.10 | 8.69 | 2.75 | 0.35 | 0.21 | 1.45 | 3.42 | 5.78 | 9.03 | 11.25 | 15.28 | 17.21 |
| 1.30 | 4.86 | 10.02 | 28.36 | 7.28 | 2.10 | 0.19 | 0.34 | 1.70 | 3.92 | 6.55 | 9.18 | 13.00 | 16.83 | 22.96 |
| 1.32 | 5.60 | 11.56 | 17.30 | 5.98 | 1.54 | 0.09 | 0.51 | 1.99 | 4.23 | 6.70 | 9.73 | 11.81 | 14.75 | 17.87 |
| 1.34 | 6.48 | 14.37 | 13.12 | 4.75 | 1.06 | 0.06 | 0.71 | 2.41 | 4.47 | 7.21 | 10.27 | 13.95 | 18.22 | 20.99 |
| 1.36 | 7.77 | 19.18 | 11.25 | 3.57 | 0.67 | 0.09 | 0.95 | 2.82 | 5.13 | 7.86 | 10.19 | 12.47 | 14.90 | 22.32 |
| 1.38 | 9.26 | 21.08 | 8.30 | 2.52 | 0.37 | 0.18 | 1.24 | 3.22 | 5.60 | 7.80 | 11.37 | 14.85 | 19.04 | 17.85 |
| 1.40 | 11.70 | 18.69 | 6.47 | 1.84 | 0.17 | 0.34 | 1.58 | 3.60 | 5.88 | 8.54 | 10.70 | 13.49 | 16.05 | 25.95 |
| 1.42 | 15.94 | 14.07 | 4.56 | 1.14 | 0.12 | 0.57 | 1.95 | 3.99 | 6.08 | 9.28 | 12.05 | 15.46 | 19.76 | 17.14 |
| 1.44 | 23.81 | 9.77 | 3.31 | 0.64 | 0.09 | 0.88 | 2.38 | 4.43 | 6.81 | 9.44 | 12.59 | 15.18 | 16.24 | 26.05 |
| 1.46 | 16.50 | 6.77 | 2.12 | 0.44 | 0.20 | 1.21 | 2.93 | 4.94 | 7.47 | 9.21 | 11.65 | 14.86 | 20.87 | 18.00 |
| 1.48 | 11.95 | 4.46 | 1.19 | 0.36 | 0.43 | 1.69 | 3.53 | 5.54 | 8.06 | 10.20 | 13.01 | 17.05 | 16.06 | 26.66 |
| 1.50 | 7.01 | 2.54 | 0.92 | 0.28 | 0.80 | 2.20 | 4.08 | 6.23 | 8.59 | 10.99 | 14.09 | 15.73 | 20.20 | 16.67 |
| 1.52 | 4.32 | 1.70 | 0.79 | 0.27 | 1.25 | 2.82 | 4.52 | 6.89 | 9.04 | 11.57 | 14.35 | 14.67 | 20.32 | 25.40 |
| 1.54 | 2.78 | 1.55 | 0.68 | 0.61 | 1.80 | 3.29 | 5.40 | 7.20 | 9.21 | 11.97 | 14.30 | 16.62 | 16.37 | 21.58 |
| 1.56 | 2.52 | 1.37 | 0.54 | 1.17 | 2.49 | 4.09 | 5.87 | 7.91 | 9.57 | 12.03 | 14.41 | 17.53 | 17.45 | 16.81 |
| 1.58 | 2.10 | 1.08 | 0.73 | 1.82 | 3.30 | 4.85 | 6.46 | 8.46 | 10.69 | 11.41 | 14.84 | 17.58 | 18.94 | 20.15 |
| 1.60 | 1.89 | 0.92 | 1.37 | 2.66 | 4.01 | 5.48 | 7.28 | 9.14 | 10.27 | 12.59 | 15.12 | 16.97 | 18.79 | 21.47 |
| 1.62 | 1.56 | 1.20 | 2.21 | 3.50 | 4.86 | 6.08 | 7.86 | 9.13 | 11.27 | 12.74 | 13.89 | 15.23 | 17.20 | 20.28 |

FIG. 14

| AMOUNT OF DETERIORATION [dB] FOR 5 MHz | | RATIO OF EIGHTH END-SIDE PITCH TO AVERAGE IDT PITCH | | | | | | | | | | | | | |
|---|---|---|---|---|---|---|---|---|---|---|---|---|---|---|---|
| | | 0.74 | 0.76 | 0.78 | 0.8 | 0.82 | 0.84 | 0.86 | 0.88 | 0.9 | 0.92 | 0.94 | 0.96 | 0.98 | 1 |
| RATIO OF IDT-REFLECTOR GAP TO AVERAGE REFLECTOR PITCH | 0.80 | 6.53 | 6.05 | 5.89 | 5.32 | 4.71 | 4.41 | 6.71 | 12.35 | 21.79 | 9.73 | 4.09 | 1.34 | 1.38 | 1.70 |
| | 0.82 | 6.72 | 6.18 | 5.41 | 4.96 | 4.51 | 5.06 | 8.91 | 18.31 | 13.63 | 5.46 | 1.84 | 0.87 | 0.97 | 1.19 |
| | 0.84 | 6.55 | 6.14 | 5.52 | 4.83 | 4.13 | 6.36 | 12.09 | 25.68 | 8.18 | 3.11 | 0.70 | 0.56 | 0.69 | 2.07 |
| | 0.86 | 6.45 | 5.94 | 5.28 | 4.55 | 4.37 | 7.91 | 16.24 | 12.64 | 5.40 | 1.55 | 0.32 | 0.44 | 1.50 | 3.33 |
| | 0.88 | 6.51 | 5.82 | 5.02 | 4.15 | 5.22 | 9.87 | 24.55 | 9.40 | 3.41 | 0.71 | 0.26 | 0.74 | 2.46 | 4.70 |
| | 0.90 | 6.62 | 5.77 | 4.84 | 3.82 | 6.23 | 12.05 | 18.52 | 6.60 | 2.14 | 0.26 | 0.21 | 1.41 | 3.29 | 5.73 |
| | 0.92 | 6.58 | 5.70 | 4.73 | 3.93 | 7.40 | 15.78 | 12.77 | 4.86 | 1.27 | 0.10 | 0.55 | 2.10 | 4.47 | 7.23 |
| | 0.94 | 6.14 | 5.47 | 4.61 | 4.53 | 8.55 | 22.16 | 10.66 | 3.56 | 0.67 | 0.07 | 0.93 | 2.87 | 5.36 | 8.38 |
| | 0.96 | 6.38 | 5.13 | 4.39 | 5.15 | 10.29 | 21.72 | 7.59 | 2.47 | 0.32 | 0.21 | 1.44 | 3.57 | 6.17 | 9.48 |
| | 0.98 | 6.29 | 5.33 | 4.00 | 5.89 | 12.10 | 17.53 | 6.29 | 1.67 | 0.13 | 0.43 | 1.97 | 4.24 | 7.05 | 10.56 |
| | 1.00 | 6.09 | 5.07 | 4.09 | 6.72 | 13.58 | 15.16 | 4.98 | 1.15 | 0.06 | 0.70 | 2.49 | 4.95 | 8.00 | 11.23 |
| | 1.02 | 6.18 | 5.00 | 3.96 | 7.63 | 17.35 | 11.88 | 3.83 | 0.73 | 0.08 | 1.02 | 2.99 | 5.66 | 8.80 | 10.95 |
| | 1.04 | 5.94 | 4.93 | 4.35 | 8.64 | 23.79 | 9.41 | 2.92 | 0.43 | 0.16 | 1.38 | 3.43 | 6.22 | 9.02 | 13.18 |
| | 1.06 | 5.97 | 4.74 | 4.85 | 9.77 | 38.15 | 7.60 | 2.22 | 0.23 | 0.31 | 1.76 | 3.80 | 6.43 | 9.88 | 13.49 |
| | 1.08 | 5.89 | 4.72 | 5.40 | 11.06 | 22.60 | 6.23 | 1.66 | 0.11 | 0.50 | 2.12 | 4.48 | 7.35 | 10.89 | 14.04 |
| | 1.10 | 5.65 | 4.55 | 6.02 | 12.55 | 17.06 | 5.13 | 1.22 | 0.13 | 0.72 | 2.41 | 5.01 | 7.98 | 10.34 | 15.24 |
| | 1.12 | 5.81 | 4.47 | 6.70 | 14.28 | 13.72 | 4.22 | 0.86 | 0.16 | 0.94 | 2.83 | 5.19 | 7.94 | 12.22 | 15.24 |
| | 1.14 | 5.33 | 4.39 | 7.48 | 16.20 | 11.31 | 3.45 | 0.58 | 0.19 | 1.17 | 3.31 | 5.90 | 9.12 | 11.28 | 16.14 |
| | 1.16 | 5.61 | 4.22 | 8.39 | 17.89 | 9.42 | 2.79 | 0.36 | 0.22 | 1.50 | 3.60 | 6.35 | 8.88 | 13.40 | 17.19 |
| | 1.18 | 5.42 | 4.69 | 9.46 | 18.22 | 7.85 | 2.20 | 0.20 | 0.34 | 1.82 | 3.96 | 6.54 | 10.10 | 11.97 | 15.75 |
| | 1.20 | 5.25 | 5.22 | 10.76 | 16.66 | 6.52 | 1.69 | 0.12 | 0.51 | 2.05 | 4.50 | 7.34 | 9.86 | 14.51 | 19.39 |
| | 1.22 | 5.36 | 5.84 | 12.44 | 14.30 | 5.38 | 1.25 | 0.13 | 0.68 | 2.41 | 4.66 | 7.14 | 11.05 | 13.36 | 15.95 |
| | 1.24 | 4.91 | 6.59 | 14.76 | 11.97 | 4.38 | 0.88 | 0.14 | 0.90 | 2.81 | 5.23 | 8.22 | 10.63 | 15.24 | 19.47 |
| | 1.26 | 5.13 | 7.49 | 18.39 | 10.24 | 3.51 | 0.58 | 0.15 | 1.18 | 3.07 | 5.65 | 8.15 | 12.03 | 15.06 | 19.66 |
| | 1.28 | 4.92 | 8.62 | 26.10 | 8.69 | 2.75 | 0.35 | 0.21 | 1.45 | 3.42 | 5.78 | 9.03 | 11.25 | 15.28 | 17.21 |
| | 1.30 | 4.86 | 10.02 | 28.36 | 7.28 | 2.10 | 0.19 | 0.34 | 1.70 | 3.92 | 6.55 | 9.18 | 13.00 | 16.83 | 22.96 |
| | 1.32 | 5.60 | 11.56 | 17.30 | 5.98 | 1.54 | 0.09 | 0.51 | 1.99 | 4.23 | 6.70 | 9.73 | 11.81 | 14.75 | 17.87 |
| | 1.34 | 6.48 | 14.37 | 13.12 | 4.75 | 1.06 | 0.06 | 0.71 | 2.41 | 4.47 | 7.21 | 10.27 | 13.95 | 18.22 | 20.99 |
| | 1.36 | 7.77 | 19.18 | 11.25 | 3.57 | 0.67 | 0.09 | 0.95 | 2.82 | 5.13 | 7.86 | 10.19 | 12.47 | 14.90 | 22.32 |
| | 1.38 | 9.26 | 21.08 | 8.30 | 2.52 | 0.37 | 0.18 | 1.24 | 3.22 | 5.60 | 7.80 | 11.37 | 14.85 | 19.04 | 17.85 |
| | 1.40 | 11.70 | 18.69 | 6.47 | 1.84 | 0.17 | 0.34 | 1.58 | 3.60 | 5.88 | 8.54 | 10.70 | 13.49 | 16.05 | 25.95 |
| | 1.42 | 15.94 | 14.07 | 4.56 | 1.14 | 0.12 | 0.57 | 1.95 | 3.99 | 6.08 | 9.28 | 12.05 | 15.46 | 19.76 | 17.14 |
| | 1.44 | 23.81 | 9.77 | 3.31 | 0.64 | 0.09 | 0.88 | 2.38 | 4.43 | 6.81 | 9.44 | 12.59 | 15.18 | 16.24 | 26.05 |
| | 1.46 | 16.50 | 6.77 | 2.12 | 0.44 | 0.20 | 1.21 | 2.93 | 4.94 | 7.47 | 9.21 | 11.65 | 14.86 | 20.87 | 18.00 |
| | 1.48 | 11.95 | 4.46 | 1.19 | 0.36 | 0.43 | 1.69 | 3.53 | 5.54 | 8.06 | 10.20 | 13.01 | 17.05 | 16.06 | 26.66 |
| | 1.50 | 7.01 | 2.54 | 0.92 | 0.28 | 0.80 | 2.20 | 4.08 | 6.23 | 8.59 | 10.99 | 14.09 | 15.73 | 20.20 | 16.67 |
| | 1.52 | 4.32 | 1.70 | 0.79 | 0.27 | 1.25 | 2.82 | 4.52 | 6.89 | 9.04 | 11.57 | 14.35 | 14.67 | 20.32 | 25.40 |
| | 1.54 | 2.78 | 1.55 | 0.68 | 0.61 | 1.80 | 3.29 | 5.40 | 7.20 | 9.21 | 11.97 | 14.30 | 16.62 | 16.37 | 21.58 |
| | 1.56 | 2.52 | 1.37 | 0.54 | 1.17 | 2.49 | 4.09 | 5.87 | 7.91 | 9.57 | 12.03 | 14.41 | 17.53 | 17.45 | 16.81 |
| | 1.58 | 2.10 | 1.08 | 0.73 | 1.82 | 3.30 | 4.85 | 6.46 | 8.46 | 10.69 | 11.41 | 14.84 | 17.58 | 18.94 | 20.15 |
| | 1.60 | 1.89 | 0.92 | 1.37 | 2.66 | 4.01 | 5.48 | 7.28 | 9.14 | 10.27 | 12.59 | 15.12 | 16.97 | 18.79 | 21.47 |
| | 1.62 | 1.56 | 1.20 | 2.21 | 3.50 | 4.86 | 6.08 | 7.86 | 9.13 | 11.27 | 12.74 | 13.89 | 15.23 | 17.20 | 20.28 |

FIG. 17

| n OF n-TH END-SIDE ELECTRODE FINGER | AMOUNT OF DETERIORATION [dB] FOR 5 MHz |
|---|---|
| n=1 | 7.87 |
| n=2 | 3.92 |
| n=3 | 2.65 |
| n=4 | 1.59 |
| n=5 | 0.89 |
| n=6 | 0.36 |
| n=7 | 0.11 |
| n=8 | 0.06 |
| n=9 | 0.16 |
| n=10 | 0.37 |
| n=11 | 0.65 |
| n=12 | 1.10 |
| n=13 | 1.67 |
| n=14 | 2.38 |
| n=15 | 3.17 |

FIG. 18

| | | RATIO OF n-TH END-SIDE PITCH TO AVERAGE IDT PITCH | | | | | | | | | | | | | |
| --- | --- | --- | --- | --- | --- | --- | --- | --- | --- | --- | --- | --- | --- | --- | --- |
| | n=1 | n=2 | n=3 | n=4 | n=5 | n=6 | n=7 | n=8 | n=9 | n=10 | n=11 | n=12 | n=13 | n=14 | n=15 |
| EXAMPLE 1 | 1.0000 | 1.0000 | 1.0000 | 1.0000 | 1.0000 | 1.0000 | 1.0000 | 0.9000 | 1.0000 | 1.0000 | 1.0000 | 1.0000 | 1.0000 | 1.0000 | 1.0000 |
| EXAMPLE 2 | 1.0000 | 1.0000 | 1.0000 | 1.0000 | 1.0000 | 1.0000 | 0.9500 | 0.9500 | 1.0000 | 1.0000 | 1.0000 | 1.0000 | 1.0000 | 1.0000 | 1.0000 |
| EXAMPLE 3 | 1.0000 | 1.0000 | 1.0000 | 1.0000 | 1.0000 | 1.0000 | 0.9667 | 0.9667 | 0.9667 | 1.0000 | 1.0000 | 1.0000 | 1.0000 | 1.0000 | 1.0000 |
| EXAMPLE 4 | 1.0000 | 1.0000 | 1.0000 | 1.0000 | 1.0000 | 0.9800 | 0.9800 | 0.9800 | 0.9800 | 0.9800 | 1.0000 | 1.0000 | 1.0000 | 1.0000 | 1.0000 |
| EXAMPLE 5 | 1.0000 | 1.0000 | 1.0000 | 1.0000 | 0.9857 | 0.9857 | 0.9857 | 0.9857 | 0.9857 | 0.9857 | 0.9857 | 1.0000 | 1.0000 | 1.0000 | 1.0000 |
| EXAMPLE 6 | 1.0000 | 1.0000 | 1.0000 | 0.9889 | 0.9889 | 0.9889 | 0.9889 | 0.9889 | 0.9889 | 0.9889 | 0.9889 | 0.9889 | 1.0000 | 1.0000 | 1.0000 |
| EXAMPLE 7 | 1.0000 | 1.0000 | 0.9909 | 0.9909 | 0.9909 | 0.9909 | 0.9909 | 0.9909 | 0.9909 | 0.9909 | 0.9909 | 0.9909 | 0.9909 | 1.0000 | 1.0000 |
| EXAMPLE 8 | 1.0000 | 0.9923 | 0.9923 | 0.9923 | 0.9923 | 0.9923 | 0.9923 | 0.9923 | 0.9923 | 0.9923 | 0.9923 | 0.9923 | 0.9923 | 0.9923 | 1.0000 |
| EXAMPLE 9 | 0.9933 | 0.9933 | 0.9933 | 0.9933 | 0.9933 | 0.9933 | 0.9933 | 0.9933 | 0.9933 | 0.9933 | 0.9933 | 0.9933 | 0.9933 | 0.9933 | 0.9933 |

| NUMBER OF ELECTRODE FINGERS HAVING REDUCED PITCH | AMOUNT OF DETERIORATION [dB] FOR 5 MHz |
|---|---|
| 1 | 0.06 |
| 2 | 0.09 |
| 3 | 0.05 |
| 5 | 0.09 |
| 7 | 0.15 |
| 9 | 0.24 |
| 11 | 0.33 |
| 12 | 0.45 |
| 13 | 0.49 |
| 15 | 0.69 |

|  | S4 | P4 | S3 | P3 | S2 | P2 | S1 | P1 |
|---|---|---|---|---|---|---|---|---|
| NUMBER (COUNT) OF COMB ELECTRODE FINGERS | 121 | 201 | 241 | 241 | 161 | 241 | 206 | 206 |
| NUMBER (COUNT) OF REFLECTIVE ELECTRODE FINGERS | 21 | 21 | 21 | 21 | 21 | 21 | 21 | 21 |
| INTERSECTION WIDTH [μm] | 26.65 | 19.03 | 18.38 | 23.82 | 26.15 | 24.44 | 11.32 | 52.66 |
| IDT WAVELENGTH [μm] | 1.969 | 2.042 | 1.962 | 2.039 | 1.979 | 2.033 | 1.969 | 2.078 |
| REFLECTOR WAVELENGTH [μm] | 2.047 | 2.049 | 2.041 | 2.032 | 2.058 | 2.117 | 2.048 | 2.082 |
| RATIO OF IDT-REFLECTOR GAP TO AVERAGE REFLECTOR PITCH | 0.80 | 1.00 | 0.80 | 1.00 | 0.80 | 0.80 | 0.80 | 1.00 |

FIG. 23A
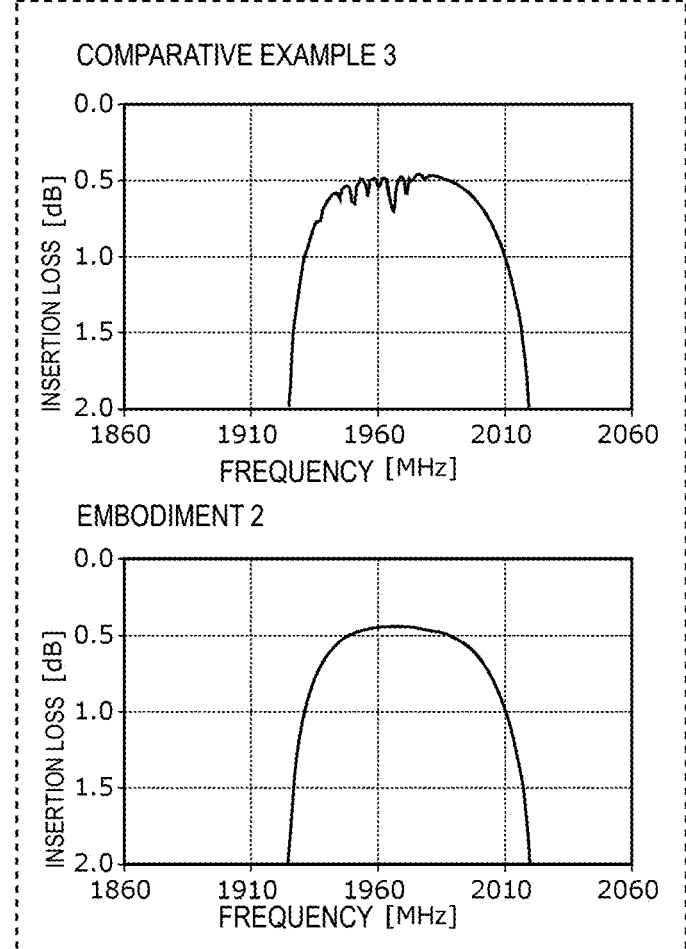
FIG. 23B
FIG. 24
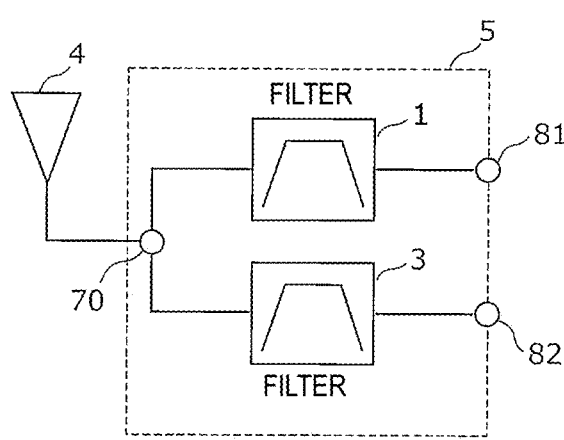

ACOUSTIC WAVE ELEMENT, ACOUSTIC WAVE FILTER DEVICE, AND MULTIPLEXER

CROSS REFERENCE TO RELATED APPLICATIONS

This application claims the benefit of priority to Japanese Patent Application No. 2021-113672, filed on Jul. 8, 2021, and is a Continuation Application of PCT Application No. PCT/JP2022/026979, filed on Jul. 7, 2022. The entire contents of each application are hereby incorporated herein by reference.

BACKGROUND OF THE INVENTION

1. Field of the Invention

The present invention relates to acoustic wave elements, acoustic wave filter devices, and multiplexers.

2. Description of the Related Art

In recent years, a multiband system has been used to improve a data transmission speed of a mobile phone. At this time, since transmission and reception in a plurality of frequency bandwidths may be performed, a plurality of filter devices that pass high-frequency signals in different frequency bandwidths are included in a front-end circuit of the mobile phone. In this case, since there is a constraint on a mounting space allowed for the front-end circuit, the plurality of filter devices are required to be compact, and to have high isolation from an adjacent band and low-loss characteristics in a pass band.

International Publication No. WO 2018/168836 discloses a configuration of a surface acoustic wave device that improves transmission characteristics. More specifically, the surface acoustic wave device has a circuit configuration including a plurality of surface acoustic wave resonators having interdigital transducer (IDT) electrodes and reflectors. In the circuit configuration described above, an inter-center distance in an acoustic wave propagation direction between an electrode finger of the reflector closest to the IDT electrode and an electrode finger of the IDT electrode closest to the reflector is 0.45 times or less of a wavelength defined by an electrode finger pitch of the reflector electrode. With this configuration, an increase in return loss on the low-frequency side of a resonant frequency of the acoustic wave resonator is prevented.

In the surface acoustic wave resonator described in International Publication No. WO 2018/168836, it is possible to prevent the increase in the return loss on the low-frequency side of the resonant frequency of the acoustic wave resonator. Meanwhile, in some bandwidths on the low-frequency side, the return loss cannot be prevented and a ripple may appear.

SUMMARY OF THE INVENTION

Example embodiments of the present invention provide acoustic wave elements, acoustic wave filter devices, and multiplexers each able to reduce or prevent a ripple generated on a low-frequency side of a resonant frequency of an acoustic wave element.

An example embodiment of the present invention provides an acoustic wave element including a piezoelectric substrate, an interdigital transducer (IDT) electrode on the piezoelectric substrate and including a pair of comb-shaped electrodes that oppose each other, and a reflector located adjacent to the IDT electrode in an acoustic wave propagation direction, wherein each comb-shaped electrode defining the pair of comb-shaped electrodes includes a plurality of comb electrode fingers extending in a direction that intersects with the acoustic wave propagation direction, the reflector includes a plurality of reflective electrode fingers extending in the direction that intersects with the acoustic wave propagation direction, and, where in a boundary region between the IDT electrode and the reflector, a distance in the acoustic wave propagation direction between a center of a comb electrode finger closest to the reflector among the plurality of comb electrode fingers and a center of a reflective electrode finger closest to the IDT electrode among the plurality of reflective electrode fingers is set as an IDT-reflector gap, an inter-center distance in the acoustic wave propagation direction between electrode fingers adjacent to each other in the acoustic wave propagation direction among the electrode fingers of each of the plurality of comb electrode fingers and the plurality of reflective electrode fingers is set as a pitch, the comb electrode finger closest to the reflector among the plurality of comb electrode fingers is set as a first end-side electrode finger, the comb electrode fingers in a direction from the first end-side electrode finger toward a center of the IDT electrode are sequentially set as an n-th end-side electrode finger (n is a natural number), a pitch between the n-th end-side electrode finger and an (n+1)-th end-side electrode finger is set as an n-th end-side pitch, an average value of each pitch by all the comb electrode fingers included in the IDT electrode is set as an average IDT pitch, an average value of each pitch by all the reflective electrode fingers included in the reflector is set as an average reflector pitch, a ratio of the n-th end-side pitch to the average IDT pitch is set as a variable represented by x, and a ratio of the IDT-reflector gap to the average reflector pitch is set as a variable represented by y, each of the ratio of the n-th end-side pitch and the ratio of the IDT-reflector gap is a value in a region surrounded by a curve defined by (Formula 1) and a curve defined by (Formula 2)

$$y=(59.084x^3-148.85x^2+122.38x-32.175)\times2 \qquad \text{(Formula 1)}$$

$$y=(73.168x^3-193.95x^2+168.75x-47.552)\times2 \qquad \text{(Formula 2)}.$$

In order to achieve the benefits described above, according to an example embodiment of the present invention, an acoustic wave filter device includes an acoustic wave element according to an example embodiment of the present invention.

In order to achieve the benefits described above, according to an example embodiment of the present invention, a multiplexer includes a plurality of filters including an acoustic wave filter device according to an example embodiment of the present invention, wherein one of an input terminal and an output terminal of each of the plurality of filters is directly or indirectly connected to a common terminal, and at least one of the plurality of filters except for the acoustic wave filter device includes a pass band higher than a frequency of a pass band of the acoustic wave filter device.

In order to achieve the benefit described above, according an example embodiment of the present invention, an acoustic wave element includes a piezoelectric substrate, an interdigital transducer (IDT) electrode on the piezoelectric substrate and includes a pair of opposing comb-shaped electrodes, and a reflector located adjacent to the IDT electrode, in which each comb-shaped electrode defining the pair of comb-shaped electrodes includes a plurality of comb electrode fingers extending in a first direction, the reflector includes a plurality of reflective electrode fingers extending in the first direction, and is located adjacent to the IDT electrode in a second direction that intersects with the first direction, and, where in a boundary region between the IDT electrode and the reflector, a distance in the second direction between a center of a comb electrode finger closest to the reflector among the plurality of comb electrode fingers and a center of a reflective electrode finger closest to the IDT electrode among the plurality of reflective electrode fingers is set as an IDT-reflector gap, an inter-center distance in the second direction between electrode fingers adjacent to each other in the second direction among the electrode fingers of each of the plurality of comb electrode fingers and the plurality of reflective electrode fingers is set as a pitch, the comb electrode finger closest to the reflector among the plurality of comb electrode fingers is set as a first end-side electrode finger, the comb electrode fingers in a direction from the first end-side electrode finger toward a center of the IDT electrode are sequentially set as an n-th end-side electrode finger (n is a natural number), a pitch between the n-th end-side electrode finger and an (n+1)-th end-side electrode finger is set as an n-th end-side pitch, an average value of each pitch by all the comb electrode fingers included in the IDT electrode is set as an average IDT pitch, an average value of each pitch by all the reflective electrode fingers included in the reflector is set as an average reflector pitch, a ratio of the n-th end-side pitch to the average IDT pitch is set as a variable represented by x, and a ratio of the IDT-reflector gap to the average reflector pitch is set as a variable represented by y, each of the ratio of the n-th end-side pitch and the ratio of the IDT-reflector gap is a value in a region surrounded by a curve defined by (Formula 1) and a curve defined by (Formula 2)

$$y = (59.084x^3 - 148.85x^2 + 122.38x - 32.175) \times 2 \qquad \text{(Formula 1)}$$

$$y = (73.168x^3 - 193.95x^2 + 168.75x - 47.552) \times 2. \qquad \text{(Formula 2)}$$

With acoustic wave elements, acoustic wave filter devices, and multiplexers according to example embodiments of the present invention, it is possible to reduce or prevent a ripple generated on a low-frequency side of a resonant frequency of an acoustic wave element.

The above and other elements, features, steps, characteristics and advantages of the present invention will become more apparent from the following detailed description of the example embodiments with reference to the attached drawings.

BRIEF DESCRIPTION OF THE DRAWINGS

FIG. 9 is a diagram illustrating the amount of deterioration for 5 MHz of the acoustic wave element of Comparative Example 1.

FIG. 10 is a table illustrating the amount of deterioration for about 5 MHz in a case where a value of an eighth end-side pitch and a value of an IDT-reflector gap are changed in the acoustic wave element of Example Embodiment 1 of the present invention.

FIG. 14 is a table illustrating the amount of deterioration for 5 MHz in the case where the value of the eighth end-side pitch and the value of the IDT-reflector gap are changed in the acoustic wave element of Example Embodiment 1 of the present invention.

FIG. 17 is a diagram illustrating the amount of deterioration for about 5 MHz in the case where n of the n-th end-side pitch of the IDT electrode is changed.

FIG. 18 is a diagram illustrating an example of a pitch of comb electrode fingers of the IDT electrode.

FIGS. 23A and 23B are graphs comparing bandpass characteristics of acoustic wave filter devices according to Example Embodiment 2 of the present invention and Comparative Example 3.

FIG. 24 is a circuit configuration diagram of a multiplexer according to Example Embodiment 3 of the present invention and a peripheral circuit of the multiplexer.

DETAILED DESCRIPTION OF THE EXAMPLE EMBODIMENTS

Figure 1:
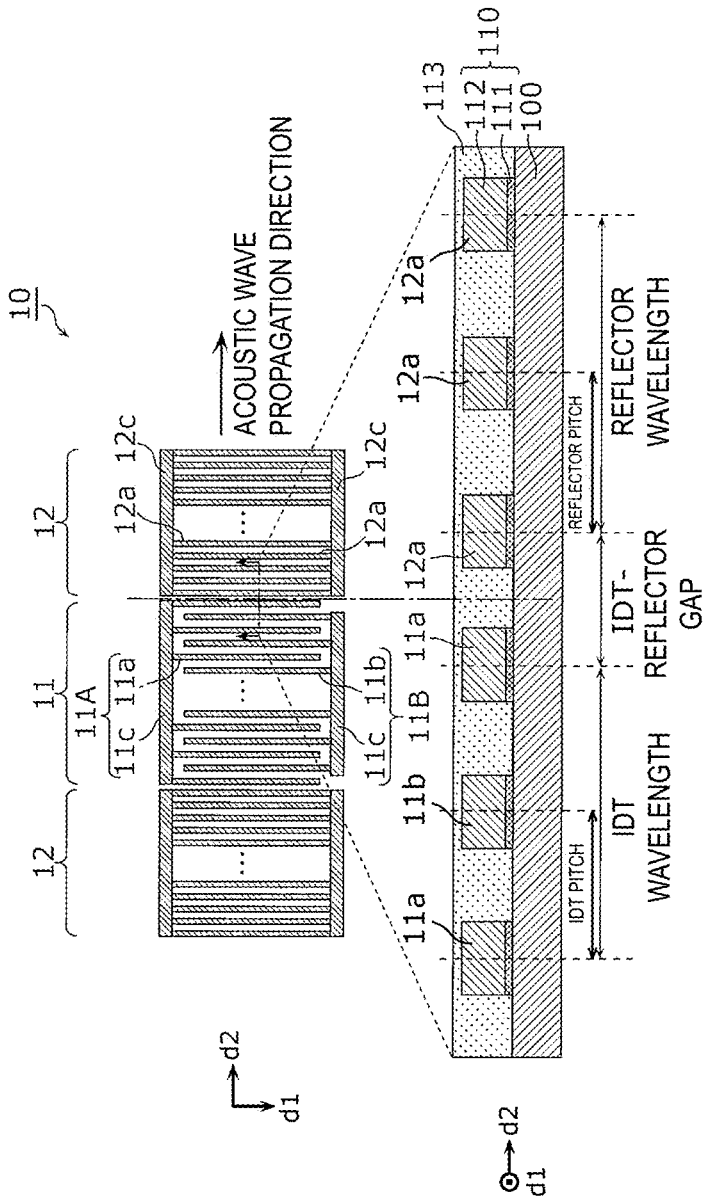
FIG. 1 is a plan view and a cross-sectional diagram schematically illustrating an electrode configuration of an acoustic wave element according to Example Embodiment 1 of the present invention.

Hereinafter, example embodiments of the present invention will be described in detail with reference to the drawings and tables. Examples to be described below are all comprehensive or specific examples. A numerical value, a shape, a material, a component, arrangement of components, a connection configuration, and the like illustrated in the following examples are examples, and do not limit the scope of the present invention. Among the components in the following examples, a component that is not described in an independent claim is described as an optional component. In addition, a size or a size ratio of the component illustrated in the drawings is not necessarily strict.

Example Embodiment 1

1.1 Configuration of Acoustic Wave Element

A configuration of an acoustic wave element 10 according to Example Embodiment 1 of the present invention will be described.

FIG. 1 is a plan view and a cross-sectional diagram schematically illustrating an electrode configuration of an acoustic wave element 10 according to Example Embodiment 1. The acoustic wave element 10 illustrated in FIG. 1 includes an interdigital transducer (IDT) electrode 11 and a reflector 12, which are provided with a piezoelectric substrate 100, an electrode 110, and a protective film 113 and configured with these components. The acoustic wave element 10 according to the present example embodiment is preferably, for example, a surface acoustic wave (SAW) resonator including the IDT electrode 11, the reflector 12, and the piezoelectric substrate 100.

The acoustic wave element 10 illustrated in FIG. 1 is used in describing a typical structure of an example embodiment, and the number, length, and the like of electrode fingers defining an electrode are not limited thereto.

The electrode 110 defining the IDT electrode 11 and the reflector 12 has a stack structure including a close contact layer 111 and a main electrode layer 112, as illustrated in the cross-sectional diagram in FIG. 1.

The close contact layer 111 is a layer which improves the adhesion between the piezoelectric substrate 100 and the main electrode layer 112, and as a material, for example, Ti is used.

As a material of the main electrode layer 112, for example, Al including Cu by about 1% is used.

The protective film 113 covers the electrode 110. The protective film 113 protects the main electrode layer 112 from an outside environment, adjusts frequency temperature characteristics, increases moisture resistance, or the like, and is, for example, a film of which a main component is silicon dioxide ($SiO_2$).

The materials defining the close contact layer 111, the main electrode layer 112, and the protective film 113 are not limited to the materials described above. Further, the electrode 110 may have another structure other than the stack structure described above. The electrode 110 may be made of, for example, a metal such as Ti, Al, Cu, Pt, Au, Ag, and Pd, or an alloy of such a metal, or may be made of a plurality of multilayer bodies including the metals or alloys described above. Further, the protective film 113 is not provided, in some cases.

The piezoelectric substrate 100 is made of, for example, a $\theta°$ Y-cut X propagation $LiNbO_3$ piezoelectric single crystal or piezoelectric ceramics (a lithium niobate single crystal or ceramics cut by a plane with an axis, as a normal line, rotated by $\theta°$ from a Y-axis in a Z-axis direction with an X-axis as a central axis, which is a single crystal or ceramics through which surface acoustic waves propagate in an X-axis direction).

The piezoelectric substrate 100 may be a substrate including a piezoelectric body layer in at least one portion, or may have a stack structure including the piezoelectric body layer. The piezoelectric substrate 100 preferably includes, for example, a high velocity support substrate, a low velocity film, and a piezoelectric body layer, and may have a structure in which the high velocity support substrate, the low velocity film, and the piezoelectric body layer are stacked in this order. Hereinafter, configurations of the high velocity support substrate, the low velocity film, and the piezoelectric body layer will be described.

The piezoelectric body layer is preferably made of, for example, a $\theta°$ Y-cut X propagation $LiNbO_3$ piezoelectric single crystal or piezoelectric ceramics (a lithium niobate single crystal or ceramics cut by a plane with an axis, as a normal line, rotated by $\theta°$ from the Y-axis in the Z-axis direction with an X-axis as a central axis, which is a single crystal or ceramics through which surface acoustic waves propagate in an X-axis direction).

The high velocity support substrate is a substrate that supports the low velocity film, the piezoelectric body layer, and the electrode 110. Further, the high velocity support substrate is a substrate in which a bulk wave in the high velocity support substrate has a higher acoustic velocity than an acoustic wave of a surface wave or a boundary wave propagating through the piezoelectric body layer, and functions to confine a surface acoustic wave in a portion at which the piezoelectric body layer and the low velocity film are stacked, and prevent the surface acoustic wave from leaking below the high velocity support substrate. The high velocity support substrate is, for example, a silicon substrate. The high velocity support substrate may be made of, for example, any of (1) a piezoelectric body such as aluminum nitride, aluminum oxide, silicon carbide, silicon nitride, silicon, sapphire, lithium tantalate, lithium niobate, or crystal quartz, (2) various ceramics such as alumina, zirconia, cordierite, mullite, steatite, or forsterite, (3) magnesia diamond, (4) a material having each of the above materials as a main component, and (5) a material having a mixture of each of the above materials as a main component.

The low velocity film is a film in which an acoustic velocity of a bulk wave in the low velocity film is lower than an acoustic velocity of an acoustic wave propagating through the piezoelectric body layer, and is located between the piezoelectric body layer and the high velocity support substrate. By the structure and the property that the energy of the acoustic wave is essentially concentrated on a medium having a low velocity, the leak of the surface acoustic wave energy to the outside of the IDT electrode is prevented. The low velocity film is, for example, a film having silicon dioxide ($SiO_2$) as a main component.

With the stack structure of the piezoelectric substrate 100, a Q factor of the acoustic wave resonator at a resonant frequency and an anti-resonant frequency can be significantly increased, as compared with a structure in which the piezoelectric substrate 100 is used as a single layer. That is, since a surface acoustic wave resonator having a high Q factor can be provided, a filter having a small insertion loss can be provided by using the surface acoustic wave resonator.

The high velocity support substrate may include a structure in which a support substrate and a high velocity film in which a bulk wave propagating therethrough has an acoustic velocity higher than an acoustic wave of a surface wave or a boundary wave propagating through the piezoelectric body layer are stacked. In this case, as the support substrate, a piezoelectric body such as, for example, sapphire, lithium tantalate, lithium niobate, or crystal quartz, various ceramics such as alumina, magnesia, silicon nitride, aluminum nitride, silicon carbide, zirconia, cordierite, mullite, steatite, forsterite, a dielectric body such as glass or a semiconductor such as silicon and gallium nitride, a resin substrate, and the like can be used. In addition, as the high velocity film, various high velocity materials, such as, for example, aluminum nitride, aluminum oxide, silicon carbide, silicon nitride, silicon oxynitride, a DLC film or diamond, a medium including the above material as a main component, a medium having a mixture of the above materials as a main component, and the like can be used.

The material or the like of each layer illustrated in the above stack structure of the piezoelectric substrate 100 is an example, and is changed according to, for example, characteristics to be emphasized among required high-frequency propagation characteristics.

As illustrated in plan view in FIG. 1, the IDT electrode 11 includes a pair of comb-shaped electrodes 11A and 11B that oppose each other. The comb-shaped electrode 11A includes a plurality of comb electrode fingers 11a extending in a direction that intersects with an acoustic wave propagation direction, and a busbar electrode 11c that connects one end of each of the plurality of comb electrode fingers 11a. The comb-shaped electrode 11B includes a plurality of comb electrode fingers 11b extending in the direction that intersects with the acoustic wave propagation direction, and the busbar electrode 11c that connects one end of each of the plurality of comb electrode fingers 11b. Each electrode finger of the plurality of comb electrode fingers 11a and 11b is located to be alternately arranged in the acoustic wave propagation direction. In a case where the comb electrode fingers 11a and 11b extend in parallel or substantially in parallel as in the present example embodiment, the acoustic wave propagation direction and a direction in which the comb electrode fingers 11a and 11b extend are orthogonal or substantially orthogonal to each other. In other words, in a case where the direction in which the comb electrode fingers 11a and 11b extend is set as a first direction d1, a second direction d2 orthogonal or substantially orthogonal to the first direction d1 on the piezoelectric substrate 100 is the same or substantially the same direction as the acoustic wave propagation direction.

The reflector 12 is located adjacent to the IDT electrode 11 in the acoustic wave propagation direction. The reflector 12 includes a plurality of reflective electrode fingers 12a located to extend in the direction that intersects with the acoustic wave propagation direction, and a busbar electrode 12c that connects one end of each of the plurality of reflective electrode fingers 12a. In a case where each of the reflective electrode fingers 12a extends in parallel or substantially in parallel as in the present example embodiment, the acoustic wave propagation direction and a direction in which the reflective electrode fingers 12a extend are orthogonal or substantially orthogonal to each other. The direction in which the reflective electrode finger 12a extends is the same or substantially the same as the first direction d1 described above.

Figure 2:
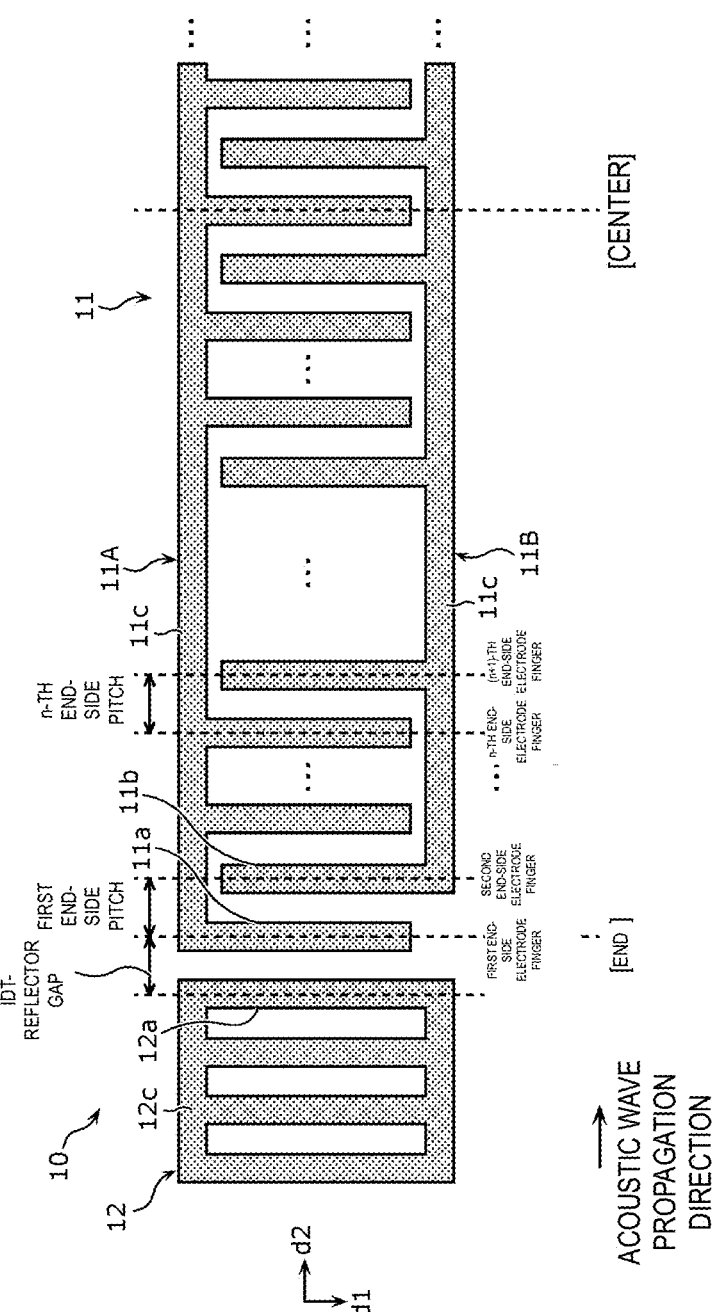
FIG. 2 is a diagram illustrating an electrode configuration of an IDT electrode and a reflector defining an acoustic wave element according to Example Embodiment 1 of the present invention.

FIG. 2 is a diagram illustrating an electrode configuration of the IDT electrode 11 and the reflector 12. For example, the plurality of comb electrode fingers 11a and 11b included in the IDT electrode 11 are preferably arranged left-right symmetrically or substantially symmetrically in the acoustic wave propagation direction, and the plurality of reflective electrode fingers 12a included in the reflector 12 are also arranged left-right symmetrically or substantially symmetrically in the acoustic wave propagation direction.

The acoustic wave element 10 according to the present example embodiment has a characteristic configuration to be described below.

First, an inter-center distance in the acoustic wave propagation direction between adjacent electrode fingers among the respective electrode fingers defining the IDT electrode 11 and the reflector 12 is set as a pitch. In addition, an average value of each pitch of all the comb electrode fingers 11a and 11b included in the IDT electrode 11 is set as an average IDT pitch $P_{IDT}$, and an average value of each pitch of all the reflective electrode fingers 12a included in the reflector 12 is set as an average reflector pitch $P_{REF}$.

The average IDT pitch $P_{IDT}$ is obtained by dividing a distance of centers in the acoustic wave propagation direction between a comb electrode finger at one end of the IDT electrode 11 and a comb electrode finger at the other end of the IDT electrode 11 in the acoustic wave propagation direction by (the total number of comb electrode fingers included in the IDT electrode 11-1). The average reflector pitch $P_{REF}$ is obtained by dividing a distance of centers in the acoustic wave propagation direction between a reflective electrode finger at one end of the reflector 12 and a reflective electrode finger at the other end of the reflector 12 in the acoustic wave propagation direction by (the total number of reflective electrode fingers included in the reflector 12-1). In addition, twice the average IDT pitch $P_{IDT}$ is an IDT wavelength ($\lambda_{IDT}$), and twice the average reflector pitch $P_{REF}$ is a reflector wavelength ($\lambda$REF).

In a boundary region between the IDT electrode 11 and the reflector 12, an inter-center distance in the acoustic wave propagation direction between a center of a comb electrode finger closest to the reflector 12 among the plurality of comb electrode fingers 11a and 11b and a center of a reflective electrode finger closest to the IDT electrode 11 among the plurality of reflective electrode fingers 12a is defined as an IDT-reflector gap, and represented as a ratio to the average reflector pitch $P_{REF}$.

In addition, a comb electrode finger closest to one reflector 12, among the plurality of comb electrode fingers 11a and 11b, is defined as a first end-side electrode finger. An electrode finger in a direction from the first end-side electrode finger to a center of the IDT electrode 11 is sequentially defined as an n-th end-side electrode finger (n is a natural number). A pitch between the n-th end-side electrode finger and an (n+1)-th end-side electrode finger is defined as an n-th end-side pitch, and is represented as a ratio to the average IDT pitch $P_{IDT}$.

It is preferable that n of the n-th end-side electrode finger is equal to or more than 6 and equal to or less than 10.

In a case where under the above definition, a ratio of the n-th end-side pitch to the average IDT pitch $P_{IDT}$ is set as a variable represented by x, and a ratio of the IDT-reflector gap to the average reflector pitch $P_{REF}$ is set as a variable represented by y, each of the ratio of the n-th end-side pitch and the ratio of the IDT-reflector gap is a value is in a region A1 (see FIG. 11) surrounded by a curve defined by (Formula 1) and a curve defined by (Formula 2)

$$y = (59.084x^3 - 148.85x^2 + 122.38x - 32.175) \times 2 \qquad \text{(Formula 1)}$$

$$y = (73.168x^3 - 193.95x^2 + 168.75x - 47.552) \times 2 \qquad \text{(Formula 2)}.$$

With this configuration, it is possible to reduce or prevent a ripple generated on a low-frequency side of a resonant frequency of the acoustic wave element 10.

1.2 Appropriate Values of n-Th End-Side Pitch and IDT-Reflector Gap

Appropriate values of an n-th end-side pitch and an IDT-reflector gap will be described while describing characteristics of an acoustic wave element. First, the IDT-reflector gap of the acoustic wave element will be described with reference to FIGS. 3 to 6.

FIGS. 3, 4, and 5 are diagrams illustrating an example of an insertion loss of the acoustic wave element in a case where the IDT-reflector gap is changed. FIGS. 3, 4, and 5 illustrate that the return loss is increased as approaching a lower side of a vertical axis.

The total number of comb electrode fingers 11*a* and 11*b* of the IDT electrode 11 in each of FIGS. 3, 4, and 5 is 107. In the present example, an example in which the IDT-reflector gap is changed in a state in which an eighth end-side pitch, which is a pitch between the eighth end-side electrode finger and a ninth end-side electrode finger, is smaller than the average IDT pitch $P_{IDT}$, specifically in a state in which the eighth end-side pitch is fixed to, for example, about 0.90 $P_{IDT}$ will be described.

Figures 3A, 3B, 3C, 3D:
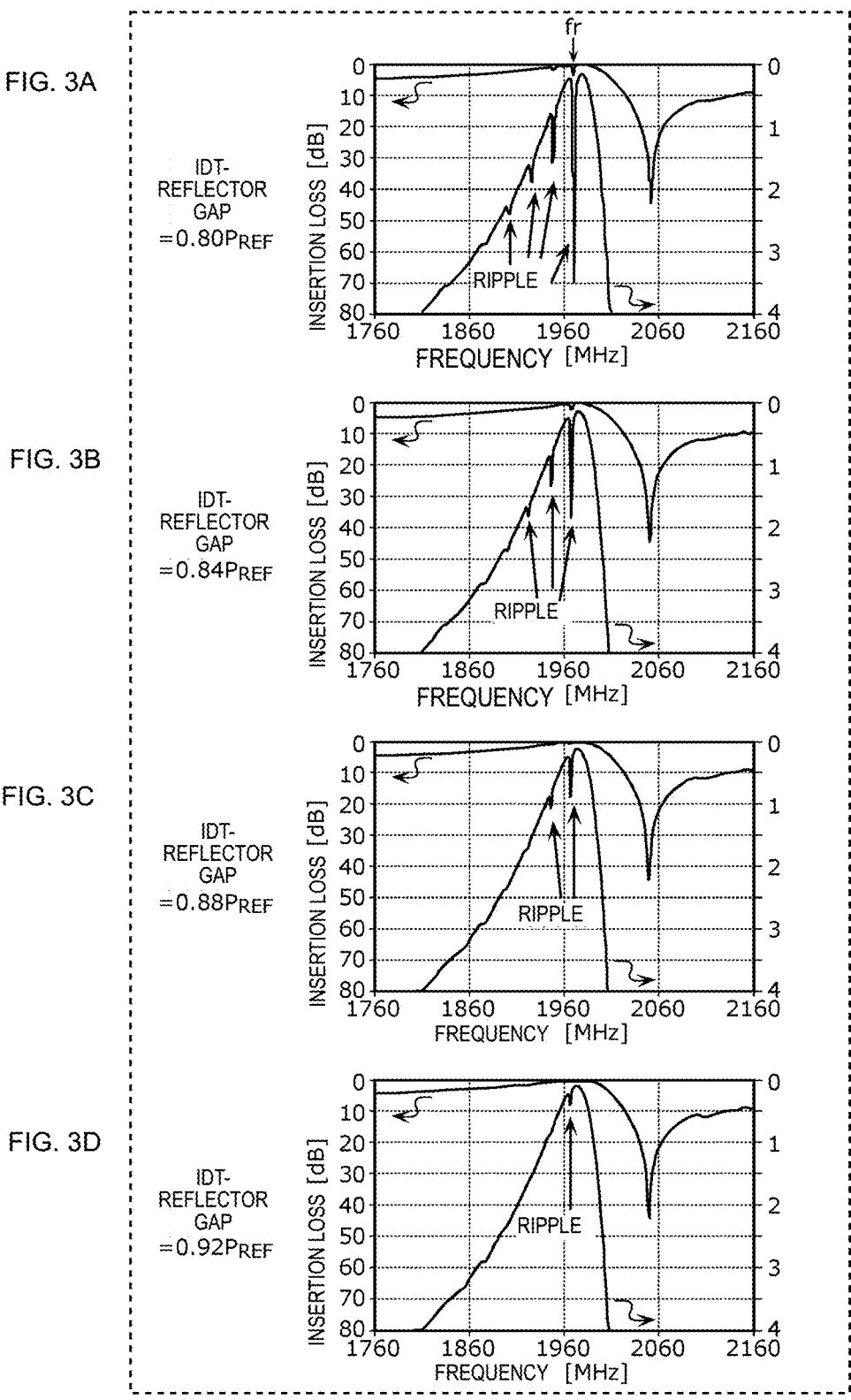
FIGS. 3A to 3D are diagrams illustrating an example of an insertion loss of an acoustic wave element in a case where an IDT-reflector gap is changed.

FIG. 3A illustrates the insertion loss of the acoustic wave element in a case where the IDT-reflector gap is set to, for example, about 0.80 $P_{REF}$. In the acoustic wave element illustrated in FIG. 3A, a ripple is generated on a low-frequency side of a resonant frequency fr of the acoustic wave element.

FIGS. 3B to 3D illustrate examples in which the IDT-reflector gap is set to, for example, about 0.84 $P_{REF}$, about 0.88 $P_{REF}$, and about 0.92 $P_{REF}$, in order. As illustrated in FIGS. 3B to 3D, the ripple is gradually reduced as the IDT-reflector gap is increased.

Figures 4A, 4B, 4C, 4D:
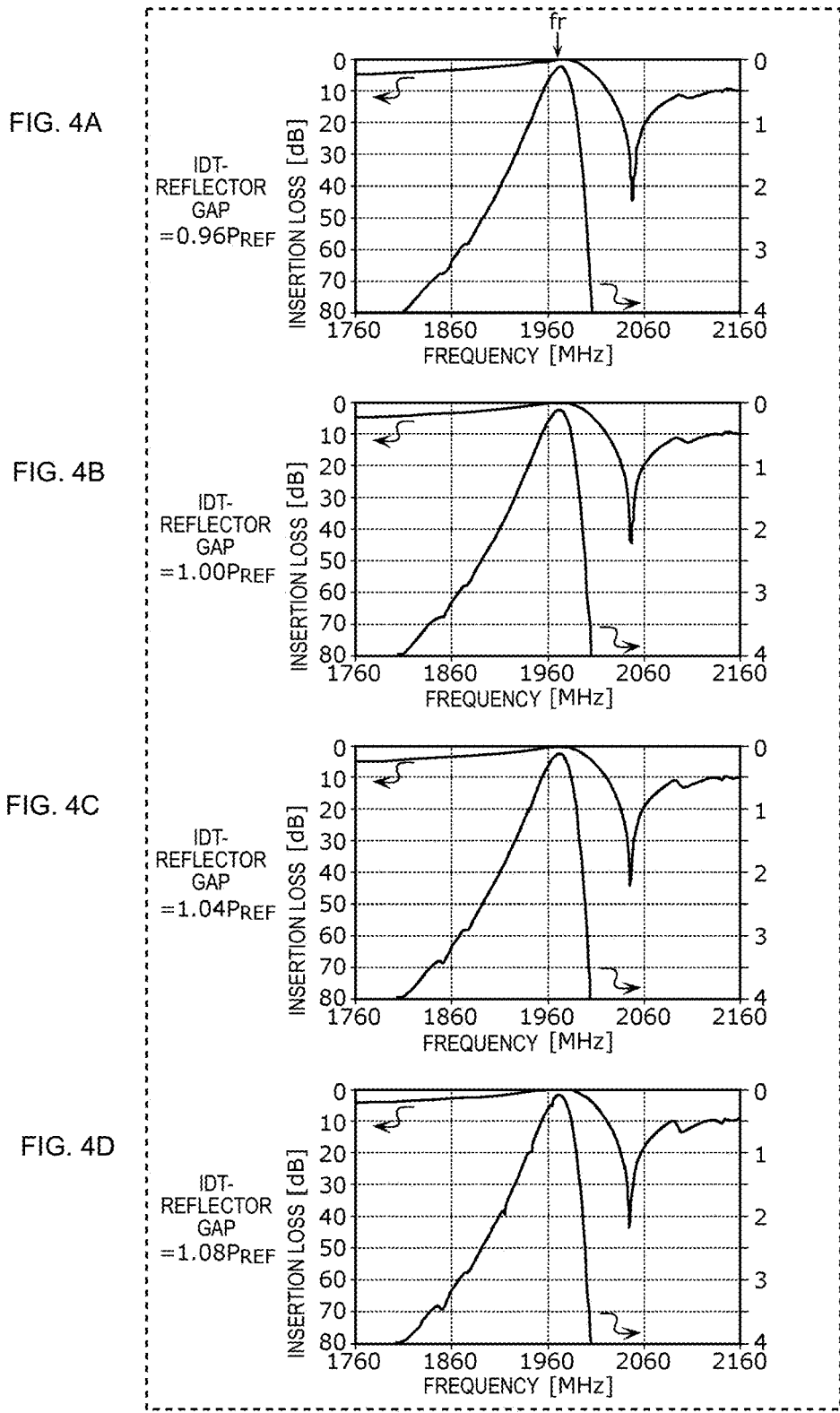
FIGS. 4A to 4D are diagrams illustrating an example of an insertion loss of an acoustic wave element in a case where the IDT-reflector gap is changed.
Figures 5A, 5B, 5C, 5D:
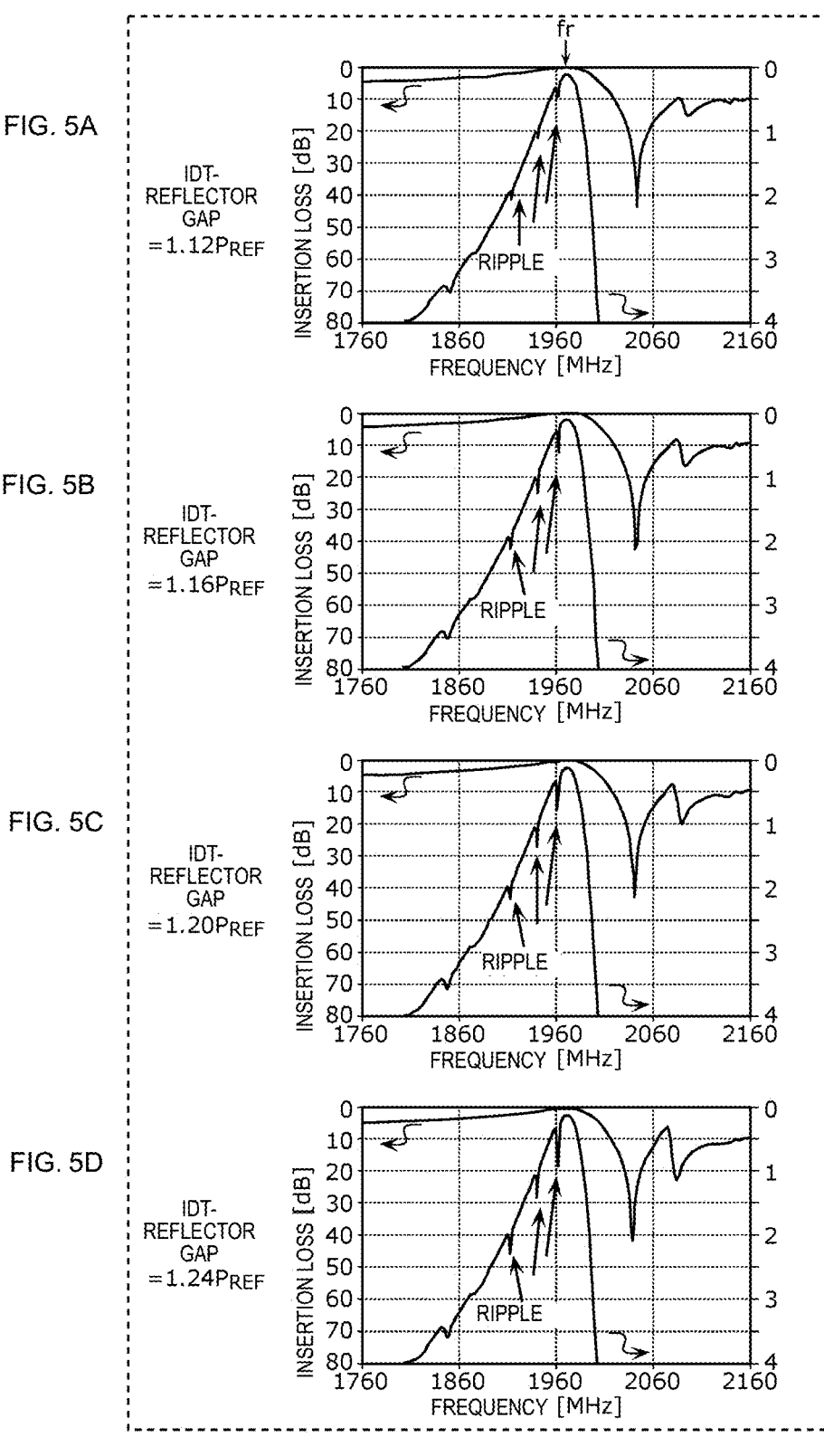
FIGS. 5A to 5D are diagrams illustrating an example of an insertion loss of an acoustic wave element in a case where the IDT-reflector gap is changed.

FIGS. 4A to 4C illustrate examples in which the IDT-reflector gap is set to, for example, about 0.96 $P_{REF}$, about 1.00 $P_{REF}$, and about 1.04 $P_{REF}$, in order. As illustrated in FIGS. 4A to 4C, the state in which the ripple is small is maintained in the ranges of the IDT-reflector gap.

FIG. 4D illustrates an example in which the IDT-reflector gap is set to, for example, about 1.08 $P_{REF}$. As illustrated in FIG. 4D, the ripple is slightly large at this IDT-reflector gap value.

FIGS. 5A to 5D are examples in which the IDT-reflector gap is set to, for example, about 1.12 $P_{REF}$, about 1.16 $P_{REF}$, about 1.20 $P_{REF}$, and about 1.24 $P_{REF}$, in order. As illustrated in FIGS. 5A to 5D, the ripple is gradually increased as the IDT-reflector gap is further increased.

As illustrated in FIGS. 3A to 3D to FIGS. 5A to 5D, by changing the IDT-reflector gap in a state in which the eighth end-side pitch of the IDT electrode 11 is fixed to, for example, about 0.90 $P_{IDT}$, a magnitude of the ripple is changed.

Figures 6A, 6B:
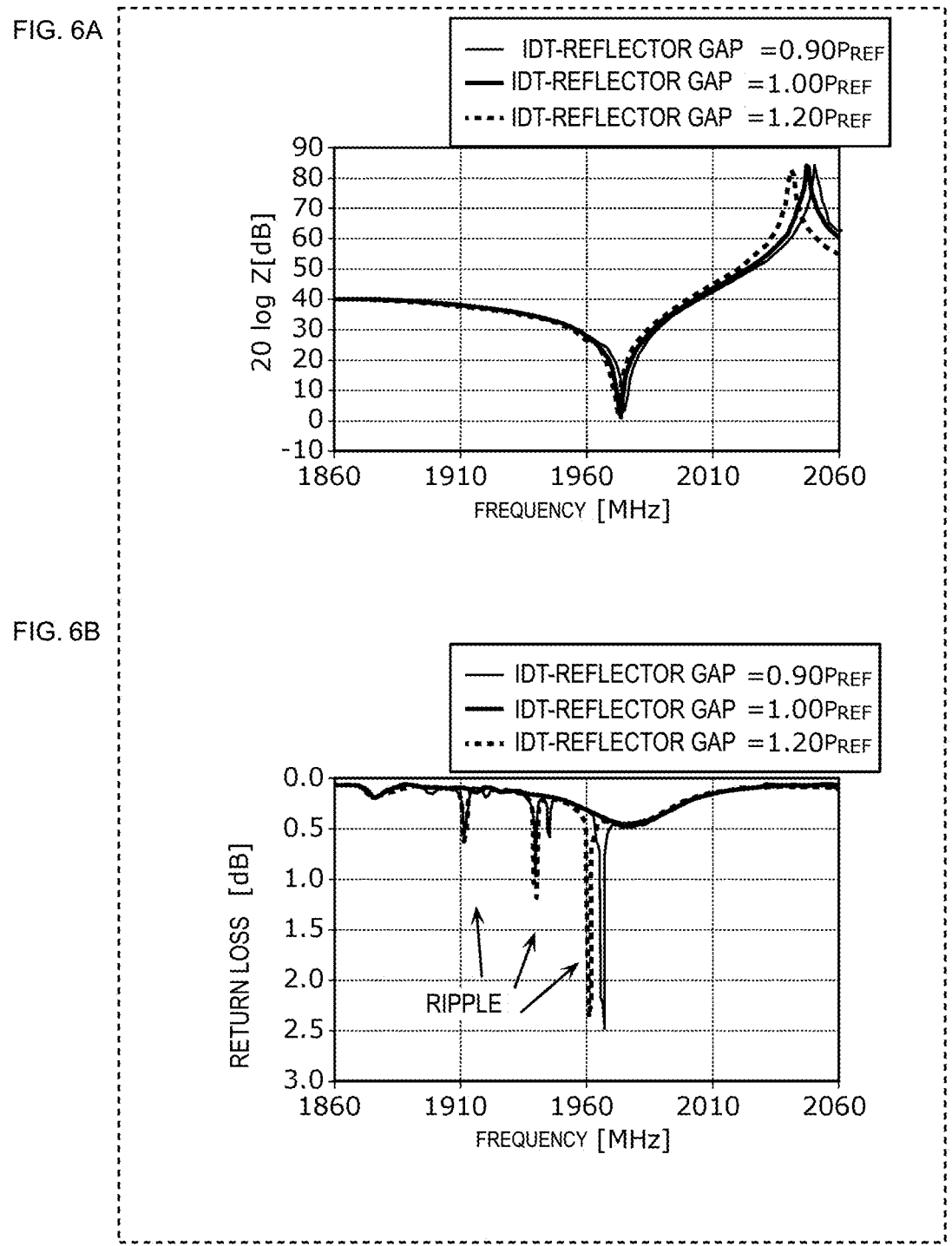
FIGS. 6A and 6B are diagrams illustrating an impedance and a return loss of an acoustic wave element in a case where the IDT-reflector gap is changed.

FIGS. 6A and 6B are diagrams illustrating an impedance and a return loss of the acoustic wave element in a case where the IDT-reflector gap is changed. FIG. 6A illustrates the impedance of the acoustic wave element, and FIG. 6B illustrates the return loss of the acoustic wave element. FIGS. 6A and 6B also illustrate examples in which the eighth end-side pitch of the IDT electrode 11 is set to, for example, about 0.90 $P_{IDT}$.

As illustrated in FIG. 6A, the resonant frequency fr of the acoustic wave element is approximately 1973 MHz. As illustrated in FIG. 6B, in a case where the IDT-reflector gap is about 0.90 $P_{REF}$, a ripple is generated on a low-frequency side of the resonant frequency fr. Further, in a case where the IDT-reflector gap is about 1.20 $P_{REF}$, a ripple is also generated on the low-frequency side of the resonant frequency fr. On the other hand, in a case where the IDT-reflector gap is about 1.00 $P_{REF}$, the generation of ripple can be prevented on the low-frequency side of the resonant frequency fr. Frequencies at which the ripples are generated is different from each other when the IDT-reflector gap is about 0.90 $P_{REF}$ and when the IDT-reflector gap is about 1.20 $P_{REF}$.

As illustrated in FIGS. 6A and 6B, by changing the IDT-reflector gap in a state in which the eighth end-side pitch of the IDT electrode 11 is fixed to about 0.90 $P_{IDT}$, a magnitude of the ripple and the frequency at which the ripple is generated are changed.

In the above, the example in which the IDT-reflector gap is changed in a state in which the eighth end-side pitch of the IDT electrode 11 is fixed is illustrated, and hereinafter, an example in which a pitch of an electrode finger at a predetermined position from an end of the IDT electrode 11 is also changed will be described. Specifically, an example in which both a value of an eighth end-side pitch of the IDT electrode 11 and a value of an IDT-reflector gap are changed will be described with reference to FIGS. 7 to 11.

Figure 7:
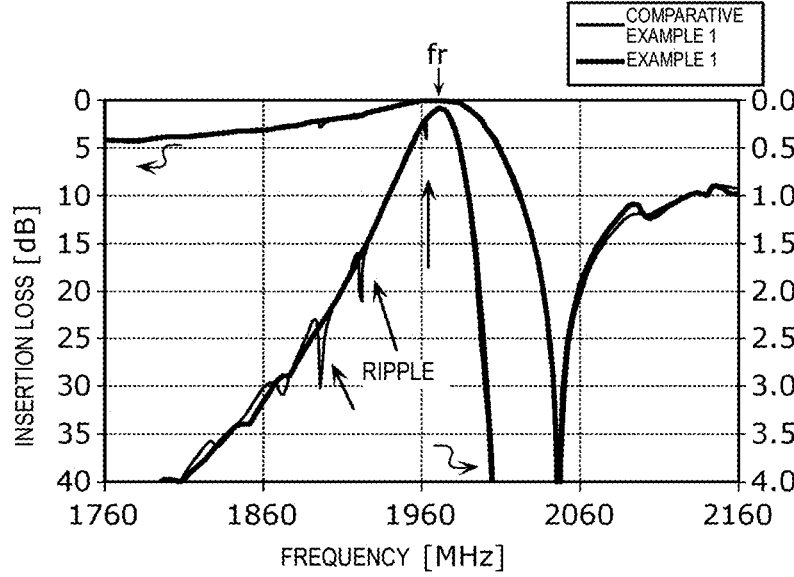
FIG. 7 is a diagram illustrating insertion losses of acoustic wave elements according to Example Embodiment 1 of the present invention and Comparative Example 1.

FIG. 7 is a diagram illustrating insertion losses of acoustic wave elements according to Example 1 and Comparative Example 1.

An electrode configuration of the acoustic wave element according to Example 1 is such that the number of comb electrode fingers of the IDT electrode 11 is 107, the number of reflective electrode fingers of the reflector 12 is 21, an IDT wavelength is about 1.974 μm, and a reflector wavelength is about 2.037 μm (about 1.032 times the IDT wavelength). In Example 1, an IDT-reflector gap is about 1.00 $P_{REF}$, and an eighth end-side pitch at a position of an eighth end-side electrode finger from an end of the IDT electrode 11 is about 0.90 $P_{IDT}$.

An electrode configuration of the acoustic wave element in Comparative Example 1 is such that the number of comb electrode fingers of the IDT electrode 11 is 107, the number of reflective electrode fingers of the reflector 12 is 21, an IDT wavelength is about 1.974 μm, and a reflector wavelength is about 2.045 μm (about 1.036 times the IDT wavelength). In Comparative Example 1, an IDT-reflector gap is about 1.00 $P_{REF}$. In Comparative Example 1, a pitch of an electrode finger (an n-th end-side pitch) at a predetermined position from an end of the IDT electrode 11 is not changed.

As illustrated in FIG. 7, in Example 1, almost no ripple is generated. Meanwhile, in Comparative Example 1, ripples are generated on a low-frequency side of the resonant frequency fr.

Here, in order to evaluate a magnitude of the ripple generated on the low-frequency side of the resonant frequency fr in detail, an evaluation item of the amount of deterioration for about 5 MHz is used.

The amount of deterioration for about 5 MHz is a difference between the maximum value and the minimum value of an insertion loss in a section of about ±2.5 MHz at a predetermined frequency. By obtaining the amount of deterioration for about 5 MHz, even in a case where the insertion loss of the acoustic wave element is changed significantly with the frequency, the loss due to the ripple can be extracted and the magnitude of the ripple can be evaluated.

Figure 8:
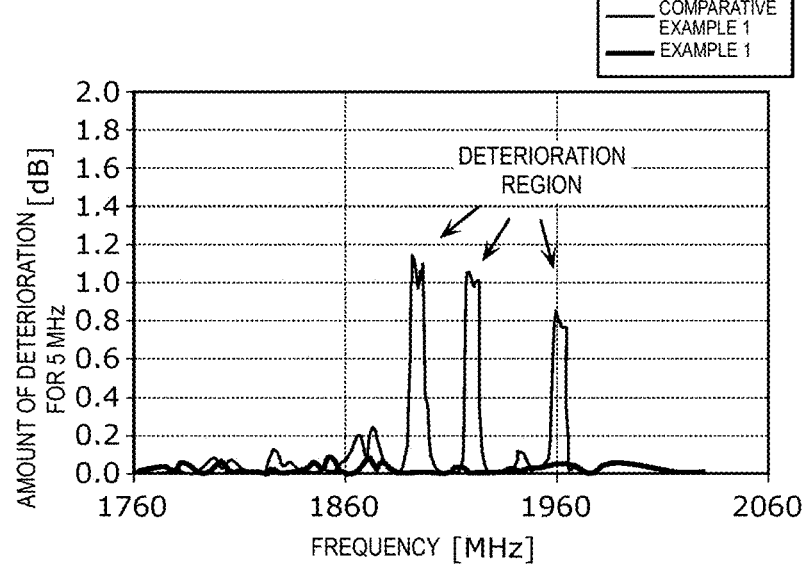
FIG. 8 is a diagram illustrating the amount of deterioration for 5 MHz of the acoustic wave element according to Example Embodiment 1 of the present invention and Comparative Example 1.

FIG. 8 is a diagram illustrating the amount of deterioration for about 5 MHz of the acoustic wave elements according to Example 1 and Comparative Example 1. A graph illustrated in FIG. 8 is provided by obtaining a difference between the maximum value and the minimum value of the insertion loss in a section of about ±2.5 MHz at each frequency, based on the insertion loss of the acoustic wave element (see FIG. 7) at frequencies about 1760 MHz to about 2160 MHz.

As illustrated in FIG. 8, the amount of deterioration for about 5 MHz of the acoustic wave element in Example 1 is equal to or less than about 0.1 dB over the entire frequency range. Meanwhile, in the acoustic wave element according to Comparative Example 1, deterioration regions are generated at frequencies corresponding to a plurality of ripples in FIG. 7. A peak value of the amount of deterioration for about 5 MHz in each deterioration region indicates a large value of approximately 1.0 dB.

For the acoustic wave element of Comparative Example 1, d among a to j to be illustrated below is selected.

FIG. 9 is a diagram illustrating the amount of deterioration for about 5 MHz of the acoustic wave element of Comparative Example 1. FIG. 9 illustrates the amount of deterioration in a case where the reflector wavelength is changed, as a to j of Comparative Example 1. Each of the amounts of deterioration illustrated in FIG. 9 is the largest value among the amounts of deterioration for about 5 MHz in the frequencies about 1760 MHz to about 2160 MHz. When the reflector wavelength is set to about $1.036\lambda_{IDT}$ as illustrated in d of Comparative Example 1, the amount of deterioration for about 5 MHz is about 1.14 dB, which becomes a small value as compared with a to c and e to j of other Comparative Example 1. Therefore, the acoustic wave element of d of Comparative Example 1 is selected as a comparison target of Example Embodiment 1.

Hereinafter, in a case where the amount of deterioration for about 5 MHz is smaller than d in Comparative Example 1, specifically, in a case where the amount of deterioration for 5 MHz is equal to or less than about 1.0 dB, it is evaluated that a ripple can be reduced.

FIG. 10 is a table illustrating the amount of deterioration for about 5 MHz in a case where a value of an eighth end-side pitch and a value of an IDT-reflector gap are changed in the acoustic wave element of Example 1.

As described above, an electrode configuration of the acoustic wave element is such that the number of comb electrode fingers of the IDT electrode 11 is 107, the number of reflective electrode fingers of the reflector 12 is 21, an IDT wavelength is about 1.974 μm, and a reflector wavelength is about 2.037 μm (about 1.032 times the IDT wavelength).

FIG. 10 illustrates the amount of deterioration for about 5 MHz in a case where a ratio of the eighth end-side pitch to the average IDT pitch $P_{IDT}$ is changed by about 0.02 $P_{IDT}$ between about 0.74 $P_{IDT}$ and about 1.00 $P_{IDT}$, and in a case where a ratio of the IDT-reflector gap to the average reflector pitch $P_{REF}$ is changed by about 0.02 $P_{REF}$ between about 0.80 $P_{REF}$ and about 1.62 $P_{REF}$. As the amount of deterioration in a table, not only a peak value of the amount of deterioration in one deterioration region illustrated in FIG. 8 but also a value obtained by adding each peak value of the amount of deterioration in a plurality of deterioration regions are described. Therefore, an evaluation as to whether or not a ripple can be reduced is a strict condition than the determination reference of about 1.0 dB or less determined based on d of Comparative Example 1.

A range surrounded by a thick frame in FIG. 10 is a range in which the amount of deterioration for about 5 MHz is equal to or less than about 1.0 dB. Therefore, when a value of the ratio of the eighth end-side pitch and a ratio value of the IDT-reflector gap are within the range surrounded by a thick frame, the amount of deterioration for about 5 MHz can be decreased and the ripple can be reduced. Hereinafter, the range surrounded by the thick frame is numerically represented.

Figure 11:
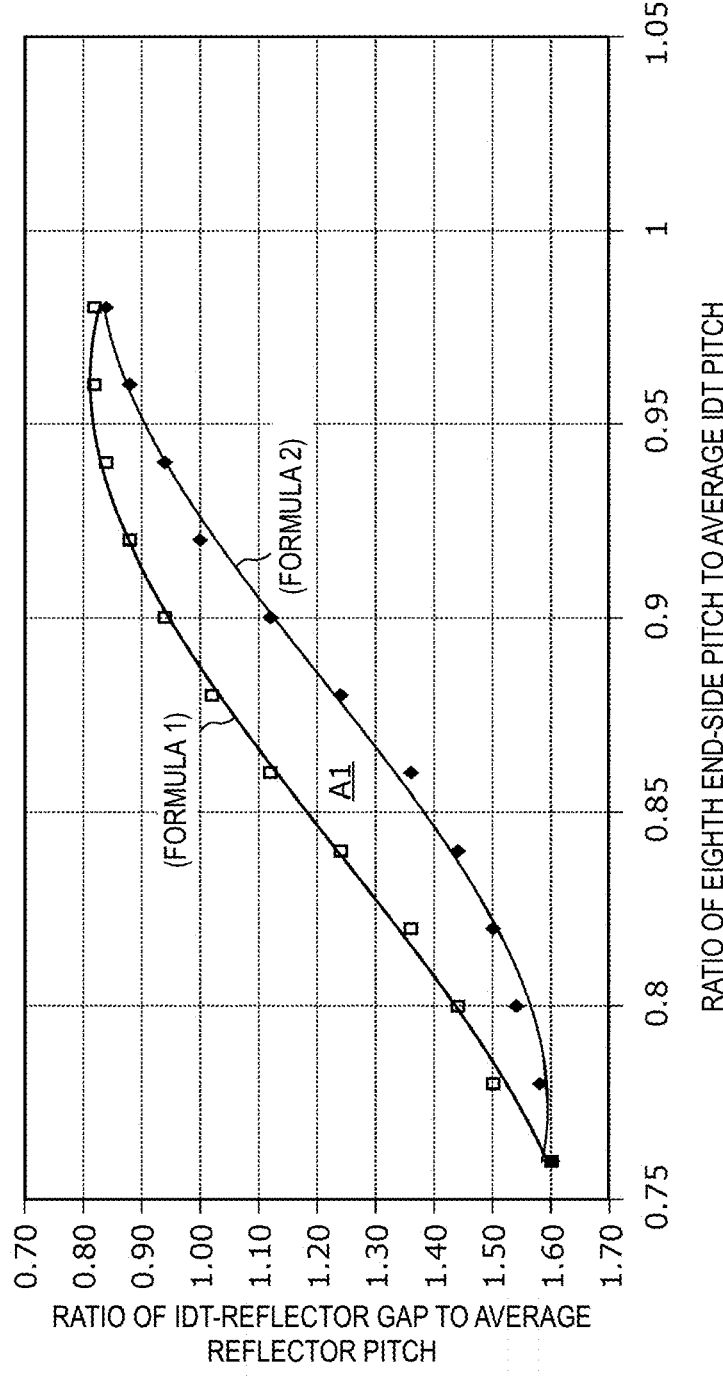
FIG. 11 is a diagram illustrating an example of appropriate values of the eighth end-side pitch and the IDT-reflector gap.

FIG. 11 is a diagram illustrating an example of appropriate values of a ratio of an eighth end-side pitch and a ratio of an IDT-reflector gap.

In a case where the ratio of the eighth end-side pitch to the average IDT pitch $P_{IDT}$ is set as a variable represented by x, and the ratio of the IDT-reflector gap to the average reflector pitch $P_{REF}$ is set as a variable represented by y, (Formula 1) illustrated in FIG. 11 is a cubic curve represented by (Formula 1).

$$y=(59.084x^3-148.85x^2+122.38x-32.175)\times2 \qquad \text{(Formula 1)}$$

Formula 1 is a formula derived by performing a polynomial regression analysis on an upper limit value of the ratio of each eighth end-side pitch in the thick frame in FIG. 10, and indicates a high correlation coefficient of about 0.998 or more.

When the ratio of the eighth end-side pitch to the average IDT pitch $P_{IDT}$ is set as a variable represented by x, and the ratio of the IDT-reflector gap to the average reflector pitch $P_{REF}$ is set as a variable represented by y, (Formula 2) illustrated in FIG. 11 is a cubic curve represented by (Formula 2).

$$y=(73.168x^3-193.95x^2+168.75x-47.552)\times2 \qquad \text{(Formula 2)}$$

Formula 2 is a formula derived by performing a polynomial regression analysis on a lower limit value of the ratio of each eighth end-side pitch in the thick frame in FIG. 10, and indicates a high correlation coefficient of about 0.998 or more.

As illustrated in FIG. 11, the appropriate values of the eighth end-side pitch and the IDT-reflector gap are represented as values in a region A1 surrounded by (Formula 1) and (Formula 2).

In the present example embodiment in this manner, in a case where the ratio of the eighth end-side pitch to the average IDT pitch $P_{IDT}$ is set as a variable represented by x, and the ratio of the IDT-reflector gap to the average reflector pitch $P_{REF}$ is set as a variable represented by y, each of the ratio of the eighth end-side pitch and the ratio of the IDT-reflector gap is a value in the region A1 surrounded by the curve defined by (Formula 1) and the curve defined by (Formula 2). With this configuration, the amount of deterioration for about 5 MHz of the acoustic wave element 10 can be reduced, and the ripple generated on the low-frequency side of the resonant frequency can be reduced.

1.3 Further Preferable Example of n-Th End-Side Pitch and IDT-Reflector Gap

Next, further preferable examples of the n-th end-side pitch and the IDT-reflector gap will be described with reference to FIGS. 12 to 15.

Figure 12:
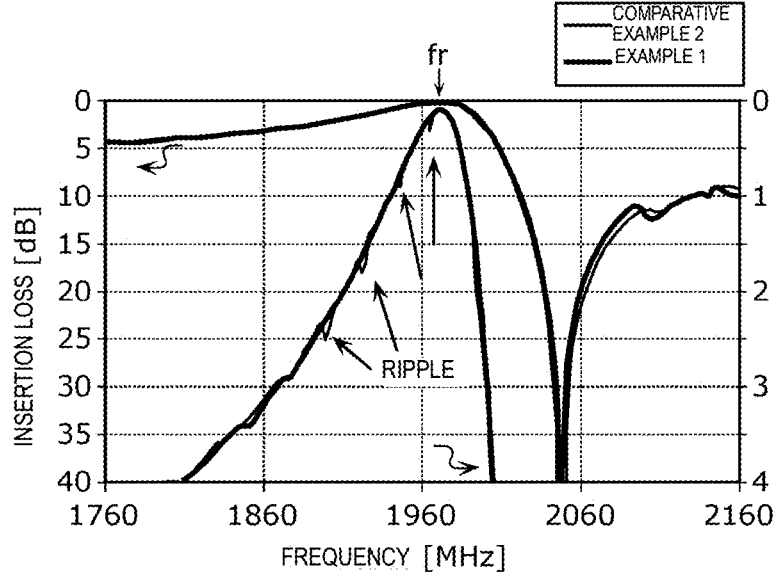
FIG. 12 is a diagram illustrating insertion losses of acoustic wave elements according to Example Embodiment 1 of the present invention and Comparative Example 2.

FIG. 12 is a diagram illustrating insertion losses of acoustic wave elements according to Example 1 and Comparative Example 2.

An electrode configuration of the acoustic wave element according to Example 1 has the same manner as the electrode configuration described above. That is, the acoustic wave element of Example 1 is such that the number of comb electrode fingers of the IDT electrode 11 is 107, the number of reflective electrode fingers of the reflector 12 is 21, an IDT wavelength is about 1.974 μm, a reflector wavelength is about 2.037 μm, an IDT-reflector gap is about 1.00 $P_{REF}$, and an eighth end-side pitch is about 0.90 $P_{IDT}$.

As the acoustic wave element of Comparative Example 2, an acoustic wave element in which a loss of about 0.2 dB is generated as a ripple with respect to the insertion loss of the acoustic wave element of Example 1 is selected. The value of about 0.2 dB is, for example, a value required from an allowable loss or the like of a filter including the acoustic wave element.

As illustrated in FIG. 12, in Example 1, almost no ripple is generated. Meanwhile, in Comparative Example 2, small ripples are generated on a low-frequency side of the resonant frequency fr.

In this example as well, in order to evaluate a magnitude of the ripple generated on the low-frequency side of the resonant frequency fr in detail, an evaluation item of the amount of deterioration for about 5 MHz is used.

Figure 13:
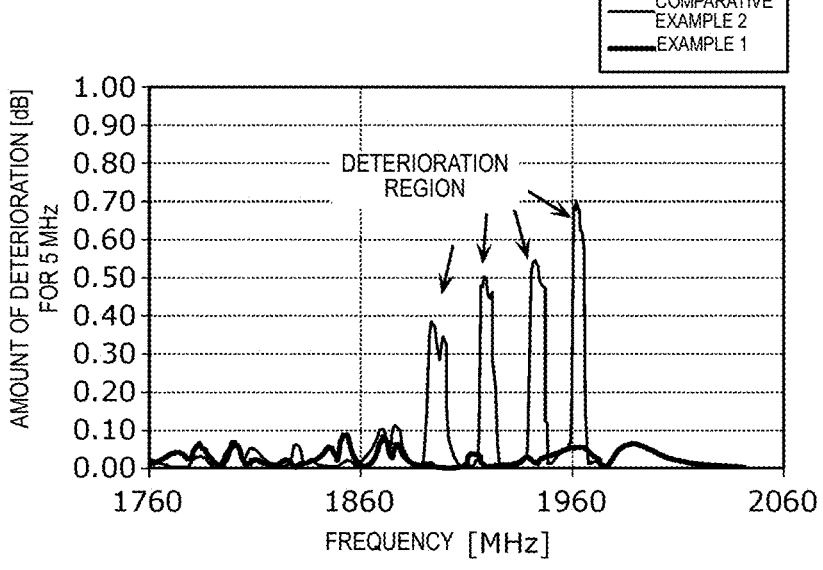
FIG. 13 is a diagram illustrating the amount of deterioration for 5 MHz of the acoustic wave elements according to Example Embodiment 1 of the present invention and Comparative Example 2.

FIG. 13 is a diagram illustrating the amount of deterioration for about 5 MHz of the acoustic wave elements according to Example 1 and Comparative Example 2. A graph illustrated in FIG. 13 is provided by obtaining a difference between the maximum value and the minimum value of the insertion loss in a section of about ±2.5 MHz at each frequency, based on the insertion loss of the acoustic wave element (see FIG. 12) at frequencies about 1760 MHz to about 2160 MHz.

As illustrated in FIG. 13, the amount of deterioration for about 5 MHz of the acoustic wave element in Example 1 is equal to or less than about 0.1 dB over the entire frequency range. Meanwhile, in the acoustic wave element according to Comparative Example 2, deterioration regions are generated at frequencies corresponding to a plurality of ripples in FIG. 12. A peak value of the amount of deterioration for about 5 MHz in the deterioration region indicates a value of approximately 0.4 dB.

In this example, in a case where the amount of deterioration for about 5 MHz is smaller than d in Comparative Example 2, specifically, in a case where the amount of deterioration for about 5 MHz is equal to or less than about 0.4 dB, it is evaluated that a ripple can be reduced.

FIG. 14 is a table illustrating the amount of deterioration for about 5 MHz in a case where a value of a ratio of an eighth end-side pitch and a value of a ratio of an IDT-reflector gap are changed in the acoustic wave element of Example 1. Numerical values illustrated in FIG. 14 are the same or substantially the same as the numerical values in FIG. 10. Meanwhile. FIG. 14 is different from FIG. 10 in a range surrounded by a thick frame.

The range surrounded by the thick frame in FIG. 14 is a range in which the amount of deterioration for about 5 MHz is equal to or less than about 0.4 dB. Therefore, when the value of the ratio of the eighth end-side pitch and the value of the ratio of the IDT-reflector gap are within the range surrounded by the thick frame, the amount of deterioration for 5 MHz can be further decreased and the ripple can be reduced. Hereinafter, the range surrounded by the thick frame is numerically represented.

Figure 15:
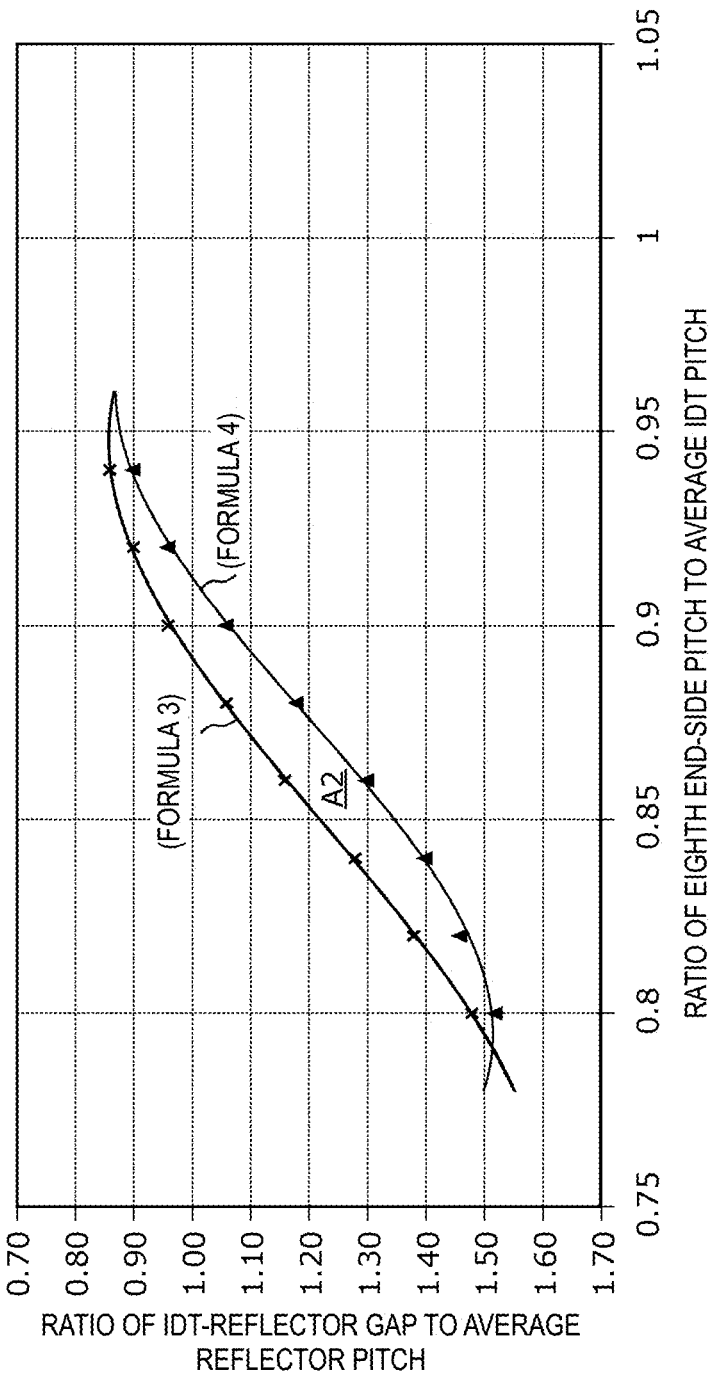
FIG. 15 is a diagram illustrating another example of the appropriate values of the eighth end-side pitch and the IDT-reflector gap.

FIG. 15 is a diagram illustrating another example of the appropriate values of the ratio of the eighth end-side pitch and the ratio of the IDT-reflector gap.

When the ratio of the eighth end-side pitch to the average IDT pitch $P_{IDT}$ is set as a variable represented by x, and the ratio of the IDT-reflector gap to the average reflector pitch $P_{REF}$ is set as a variable represented by y, (Formula 3) illustrated in FIG. 15 is a cubic curve represented by (Formula 3).

$$y=(94.697x^3-240.91x^2+201.48x-54.749)\times 2 \qquad \text{(Formula 3)}$$

Formula 3 is a formula derived by performing a polynomial regression analysis on an upper limit value of the ratio of each eighth end-side pitch in the thick frame in FIG. 14, and indicates a high correlation coefficient of about 0.998 or more.

When the ratio of the eighth end-side pitch to the average IDT pitch $P_{IDT}$ is set as a variable represented by x, and the ratio of the IDT-reflector gap to the average reflector pitch $P_{REF}$ is set as a variable represented by y, (Formula 4) illustrated in FIG. 15 is a cubic curve represented by (Formula 4).

$$y=(142.05x^3-373.86x^2+325.08x-92.761)\times 2 \qquad \text{(Formula 4)}$$

Formula 4 is a formula derived by performing a polynomial regression analysis on a lower limit value of the ratio of each eighth end-side pitch in the thick frame in FIG. 14, and indicates a high correlation coefficient of about 0.998 or more.

As illustrated in FIG. 15, the appropriate values of the ratio of the eighth end-side pitch and the ratio of the IDT-reflector gap are represented as values in a region A2 surrounded by (Formula 3) and (Formula 4).

In this example, in a case where the ratio of the eighth end-side pitch to the average IDT pitch $P_{IDT}$ is set as a variable represented by x, and the ratio of the IDT-reflector gap to the average reflector pitch $P_{REF}$ is set as a variable represented by y, each of the ratio of the eighth end-side pitch and the ratio of the IDT-reflector gap is a value in the region A2 surrounded by the curve defined by (Formula 3) and the curve defined by (Formula 4). With this configuration, the amount of deterioration for 5 MHz of the acoustic wave element 10 can be further reduced, and the ripple generated on the low-frequency side of the resonant frequency can be further reduced.

1.4 Example in which n of n-Th End-Side Pitch is Changed

Next, an example in which n of an n-th end-side pitch is changed, that is, an example in which a position at which a pitch of an electrode finger is made smaller than the average IDT pitch $P_{IDT}$ is changed will be described with reference to FIGS. 16 and 17.

Figures 16A, 16B:
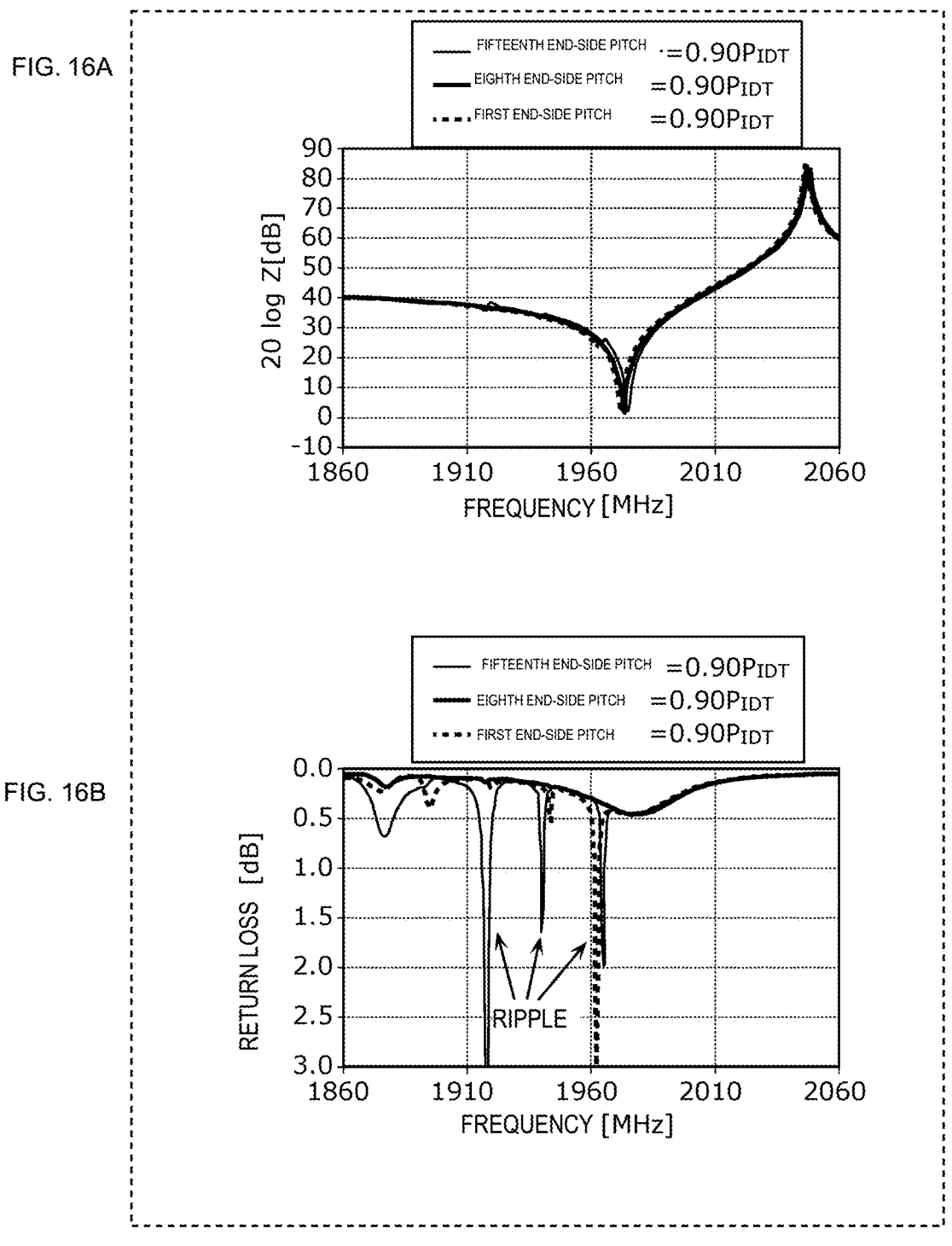
FIGS. 16A and 16B are diagrams illustrating the impedance and the return loss of the acoustic wave element in a case where n of an n-th end-side pitch of the IDT electrode is changed.

FIGS. 16A and 16B are diagrams illustrating an impedance and a return loss of an acoustic wave element in a case where n of an n-th end-side pitch of the IDT electrode 11 is changed. FIG. 16A illustrates the impedance of the acoustic wave element, and FIG. 16B illustrates the return loss of the acoustic wave element. FIGS. 16A and 16B illustrates examples in which an IDT-reflector gap of the acoustic wave element is fixed to about 1.00 $P_{REF}$, the n-th end-side pitch is fixed to about 0.90 $P_{IDT}$, and n of the n-th end-side pitch is changed.

As illustrated in FIG. 16A, the resonant frequency fr of the acoustic wave element is approximately 1973 MHz. As illustrated in FIG. 16B, in a case where a first end-side pitch is about 0.90 $P_{IDT}$, ripples are generated on a low-frequency side of the resonant frequency fr. Further, in a case where a fifteenth end-side pitch is about 0.90 $P_{IDT}$, ripples are also generated on the low-frequency side of the resonant frequency fr. On the other hand, in a case where an eighth end-side pitch is about 0.90 $P_{IDT}$, the generation of ripple can be prevented on the low-frequency side of the resonant frequency fr.

FIG. 17 is a diagram illustrating the amount of deterioration for about 5 MHz in a case where n of the n-th end-side pitch of the IDT electrode 11 is changed. In FIG. 17, the IDT-reflector gap is about 1.00 $P_{REF}$, and the n-th end-side pitch is about 0.90 $P_{IDT}$.

As illustrated in FIG. 17, by setting n of the n-th end-side electrode finger to be 6 or more and 10 or less, the amount of deterioration for 5 MHz can be about 1.0 dB or less. With this configuration, it is possible to reduce the ripple generated on the low-frequency side of the resonant frequency. By setting n of the n-th end-side electrode finger to 7 or 8, the amount of deterioration for 5 MHz can be about 0.4 dB or less. With this configuration, the ripple generated on the low-frequency side of the resonant frequency can be further reduced.

1.5 Example in which Plurality of n-Th End-Side Pitches are Smaller than Average Pitch Next, an example in which a plurality of n-th end-side pitches are smaller than the average IDT pitch $P_{IDT}$ will be described.

FIG. 18 is a diagram illustrating an example of a pitch of the comb electrode fingers 11a and 11b of the IDT electrode 11. FIG. 18 illustrates an example in which the pitch of one or a plurality of electrode fingers with the eighth end-side electrode finger as a center is smaller than the average IDT pitch $P_{IDT}$.

In Example 1, an example in which an eighth end-side pitch is smaller than the average IDT pitch $P_{IDT}$ is illustrated. Specifically, the eighth end-side pitch is about 0.90 times an average value (1.000) of the remaining pitches obtained by excluding the eighth end-side pitch from all the pitches of the plurality of comb electrode fingers 11a and 11b.

In Example 2, an example in which a seventh end-side pitch and an eighth end-side pitch are smaller than the average IDT pitch $P_{IDT}$ is illustrated. Specifically, each of the seventh end-side pitch and the eighth end-side pitch is about 0.95 times an average value (1.000) of the remaining pitches obtained by excluding the seventh end-side pitch and the eighth end-side pitch from all the pitches of the plurality of comb electrode fingers 11a and 11b.

In Example 3, an example in which a seventh end-side pitch to a ninth end-side pitch is smaller than the average IDT pitch $P_{IDT}$ is illustrated. Specifically, each of the seventh end-side pitch to the ninth end-side pitch is about 0.9667 times an average value (1.000) of the remaining pitches obtained by excluding the seventh end-side pitch to the ninth end-side pitch from all the pitches of the plurality of comb electrode fingers 11a and 11b.

In Example 4, an example in which a sixth end-side pitch to a tenth end-side pitch is smaller than the average IDT pitch $P_{IDT}$ is illustrated. Specifically, each of the sixth end-side pitch to the tenth end-side pitch is about 0.98 times an average value (1.000) of the remaining pitches obtained by excluding the sixth end-side pitch to the tenth end-side pitch from all the pitches of the plurality of comb electrode fingers 11a and 11b.

In Example 5, an example in which a fifth end-side pitch to an eleventh end-side pitch is smaller than the average IDT pitch $P_{IDT}$ is illustrated. Specifically, each of the fifth end-side pitch to the eleventh end-side pitch is about 0.9857 times an average value (1.000) of the remaining pitches obtained by excluding the fifth end-side pitch to the eleventh end-side pitch from all the pitches of the plurality of comb electrode fingers 11a and 11b.

In Example 6, an example in which a fourth end-side pitch to a twelfth end-side pitch is smaller than the average IDT pitch $P_{IDT}$ is illustrated. Specifically, each of the fourth end-side pitch to the twelfth end-side pitch is about 0.9889 times an average value (1.000) of the remaining pitches obtained by excluding the fourth end-side pitch to the twelfth end-side pitch from all the pitches of the plurality of comb electrode fingers 11a and 11b.

In Example 7, an example in which a third end-side pitch to a thirteenth end-side pitch is smaller than the average IDT pitch $P_{IDT}$ is illustrated. Specifically, each of the third end-side pitch to the thirteenth end-side pitch is about 0.9909 times an average value (1.000) of the remaining pitches obtained by excluding the third end-side pitch to the thirteenth end-side pitch from all the pitches of the plurality of comb electrode fingers 11a and 11b.

Examples 8 and 9 are as illustrated in FIG. 18.

That is, in Examples 1 to 9, the IDT electrode 11 has one or a plurality of n-th end-side pitches disposed in order in the acoustic wave propagation direction, and the n-th end-side pitch has a relationship represented by (Formula 5) below.

$$\text{n-th end-side pitch}=1-(\text{distance shortened by adopting one or a plurality of } n\text{-th end-side pitches/number of } n\text{-th end-side pitches}) \quad \text{(Formula 5)}$$

In Formula 5, the distance shortened by providing one or the plurality of n-th end-side pitches is a distance that becomes short in the acoustic wave propagation direction in a case where some pitches of the plurality of comb electrode fingers 11a and 11b are set as one or the plurality of n-th end-side pitches, by using a distance at both ends of the original plurality of comb electrode fingers 11a and 11b as a reference.

For example, in the case of Example 1, the eighth end-side pitch is calculated by $1-(0.1/1)$=about 0.90. In the case of Example 2, each of the seven-th end-side pitch and the eighth end-side pitch is calculated by $1-(0.1/2)$=about 0.95. In the case of Example 5, each of the fifth end-side pitch to the eleventh end-side pitch is calculated by $1-(0.1/7)$=about 0.9857. In the case of Example 7, each of the third end-side pitch to the thirteenth end-side pitch is calculated by $1-(0.1/11)$=about 0.9909.

Figures 19, 20:
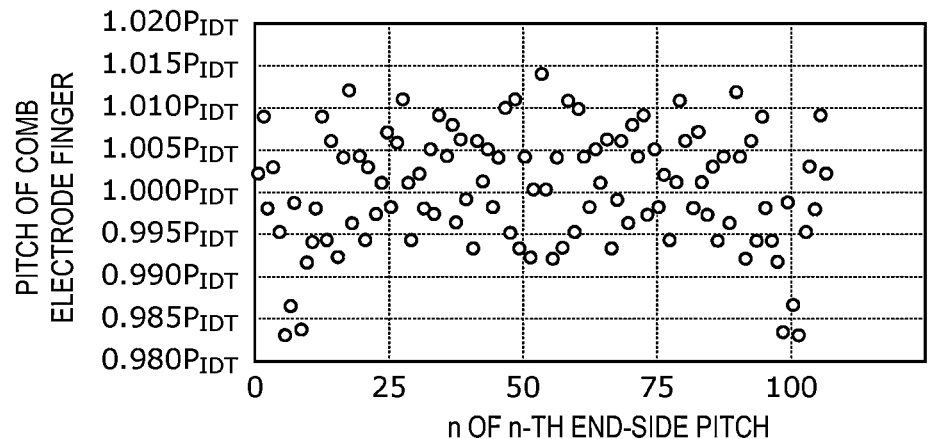
FIG. 19 is a diagram illustrating the amount of deterioration for about 5 MHz in a case where the number of electrode fingers having a reduced pitch, which are centered on an eighth end-side electrode finger of the IDT electrode, is changed.
FIG. 20 is a diagram illustrating an example of a pitch of the comb electrode finger of the IDT electrode and a reflective electrode finger of the reflector.

FIG. 19 is a diagram illustrating the amount of deterioration for about 5 MHz in a case where the number of electrode fingers having a reduced pitch, which are centered on an eighth end-side pitch of the IDT electrode 11, is changed. In FIG. 19, an IDT-reflector gap is set to about 1.00 $P_{REF}$.

As illustrated in FIG. 19, by setting the number of electrode fingers having the reduced pitch, which are centered on the eighth end-side pitch, to be 11 or less, the amount of deterioration for about 5 MHz can be reduced up to about 1.0 dB or less. With this configuration, it is possible to reduce or prevent the ripple generated on the low-frequency side of the resonant frequency. Further, by setting the number of electrode fingers having the reduced pitch, which are centered on the eighth end-side pitch, to be 7 or less, the amount of deterioration in about 5 MHz can be reduced up to about 0.4 dB or less. With this configuration, the ripple generated on the low-frequency side of the resonant frequency can be further reduced or prevented.

1.6 Example in which Pitch of Electrode Fingers is Set as Random Pitch

An example in which a pitch of electrode fingers is set to a random pitch will be described.

FIG. 20 is a diagram illustrating an example of a pitch of the comb electrode fingers 11a and 11b of the IDT electrode 11.

FIG. 20 illustrates a value of each pitch when the total number of comb electrode fingers 11a and 11b included in the IDT electrode 11 is 107. In FIG. 20, a horizontal axis indicates a position of each pitch as a value of n of an n-th end-side pitch, and a vertical axis indicates the value of each pitch of the comb electrode fingers 11a and 11b. The pitch on the vertical axis is a value when an average IDT pitch is set to about 1.00 $P_{IDT}$.

In this example, a total of five pitches centered on an eighth end-side pitch are set to be about 0.986 times the average IDT pitch $P_{IDT}$. That is, in a case where only the eighth end-side pitch is changed, it corresponds to about 0.932 $P_{IDT}$. An IDT-reflector gap is about 1.00 $P_{REF}$, and satisfies the condition of the region A1 illustrated in FIG. 11.

In addition, the plurality of comb electrode fingers 11a and 11b are arranged such that adjacent pitches in the acoustic wave propagation direction are irregularly increased and decreased. That is, the plurality of comb electrode fingers 11a and 11b are randomly disposed such that the pitch of the adjacent comb electrode fingers 11a and 11b is irregularly changed. The irregular change is a change that includes a randomly changing state without including a constant state, a proportional change, or a periodic change.

Among the plurality of n-th end-side pitches in this example, adjacent pitches in the acoustic wave propagation direction may be irregularly increased and decreased. In the acoustic wave element 10 having such a pitch of the comb electrode fingers 11a and 11b, the ripple generated on the low-frequency side of the resonant frequency of the acoustic wave element 10 can be reduced.

Example Embodiment 2

In Example Embodiment 2, an acoustic wave filter device using the acoustic wave element 10 according to Example Embodiment 1 will be described. By defining the acoustic wave filter device using the acoustic wave element 10 according to Example Embodiment 1, it is possible to reduce or prevent a deterioration of an insertion loss in a pass band.

Figures 21, 22:
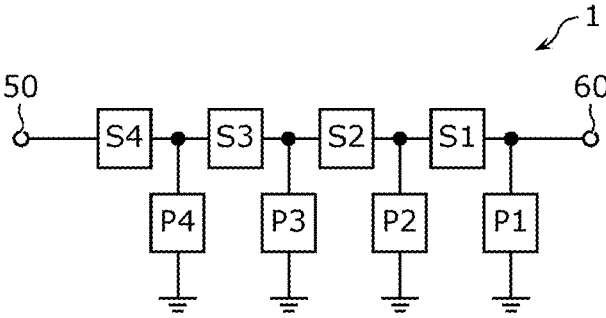
FIG. 21 is a diagram illustrating a circuit configuration of an acoustic wave filter device according to Example Embodiment 2 of the present invention.
FIG. 22 is a diagram illustrating an electrode parameter of an acoustic wave element defining the acoustic wave filter device according to Example Embodiment 2 of the present invention.

FIG. 21 is a diagram illustrating a circuit configuration of an acoustic wave filter device 1 according to Example Embodiment 2. FIG. 22 is a diagram illustrating electrode parameters of the acoustic wave element 10 defining the acoustic wave filter device 1. Regarding an intersection width in FIG. 22, when a direction in which a plurality of electrode fingers extends is set as an electrode finger extending direction, a region in which adjacent electrode fingers overlap with each other in a direction perpendicular to the electrode finger extending direction is an intersection region, and a dimension of the intersection region along the electrode finger extending direction is the intersection width.

As illustrated in FIGS. 21 and 22, the acoustic wave filter device 1 includes a first input and output terminal 50 and a second input and output terminal 60, series arm resonators S1, S2, S3, and S4 connected between the first input and output terminal 50 and the second input and output terminal 60, parallel arm resonators P1, P2, P3, and P4 connected to a node on a path connecting the first input and output terminal 50 and the second input and output terminal 60 and to a ground. The acoustic wave element 10 according to Example Embodiment 1 is preferably used for each of the series arm resonators S1 to S4.

FIGS. 23A and 23B are graphs comparing bandpass characteristics of acoustic wave filter devices according to Example Embodiment 2 and Comparative Example 3. In the acoustic wave filter device of Comparative Example 3, all the pitches of the plurality of comb electrode fingers defining the IDT electrode of the acoustic wave element are the same.

As illustrated in FIGS. 23A and 23B, when the bandpass characteristics of Comparative Example 3 and the bandpass characteristics of Example Embodiment 2 are compared, the insertion loss in Example Embodiment 2 is smaller than the insertion loss in Comparative Example 3. In this manner, in the acoustic wave filter device 1 of the present example embodiment, it is possible to prevent the deterioration of the insertion loss in a pass band.

Example Embodiment 3

FIG. 24 is a circuit configuration diagram of a multiplexer 5 according to Example Embodiment 3 and a peripheral circuit (antenna 4) of the multiplexer 5. The multiplexer 5 illustrated in FIG. 24 preferably includes the acoustic wave filter device 1, a filter 3, a common terminal 70, and input and output terminals 81 and 82.

Regarding the acoustic wave filter device 1, the input and output terminal 50 of the acoustic wave filter device 1 is connected to the common terminal 70, and the input and output terminal 60 of the acoustic wave filter device 1 is connected to the input and output terminal 81.

The filter 3 is connected to the common terminal 70 and the input and output terminal 82. The filter 3 is preferably, for example, a ladder acoustic wave filter including a parallel arm resonator and a series arm resonator. Meanwhile, the filter 3 may be an LC filter or the like, and the circuit configuration thereof is not particularly limited.

Here, a pass band of the acoustic wave filter device 1 is located on a low-frequency side of a pass band of the filter 3.

In some cases, the acoustic wave filter device 1 and the filter 3 is not directly connected to the common terminal 70 as illustrated in FIG. 24, and may be indirectly connected to the common terminal 70 with, for example, an impedance matching circuit, a phase shifter, a circulator, or a switch element capable of selecting two or more filters therebetween.

In addition, in the present example embodiment, as the multiplexer 5, the circuit configuration in which two filters are connected to the common terminal 70 is used. Meanwhile, the number of filters connected to the common terminal 70 is not limited to two, and may be three or more. That is, the multiplexer according to the present invention preferably includes a plurality of filters including the acoustic wave filter device 1, and one of an input terminal and an output terminal of each of the plurality of filters may be directly or indirectly connected to a common terminal, and at least one of the plurality of filters other than the acoustic wave filter device 1 may have a pass band higher than a frequency of a pass band of the acoustic wave filter device 1.

SUMMARY

The acoustic wave element 10 according to the present example embodiment is an acoustic wave element that propagates a high-frequency signal in a predetermined acoustic wave propagation direction, and includes the piezoelectric substrate 100, the IDT electrode 11 including the pair of comb-shaped electrodes 11A and 11B that oppose each other, and the reflector 12 located adjacent to the IDT electrode 11 in the acoustic wave propagation direction, which are formed on the piezoelectric substrate 100. Each of the comb-shaped electrodes 11A and 11B defining the pair of comb-shaped electrodes 11A and 11B includes the plurality of comb electrode fingers 11a and 11b extending in a direction that intersects with the acoustic wave propagation direction. The reflector 12 has the plurality of reflective electrode fingers 12a extending in the direction that intersects with the acoustic wave propagation direction. In a boundary region between the IDT electrode 11 and the reflector 12, a distance in the acoustic wave propagation direction between a center of a comb electrode finger closest to the reflector 12 among the plurality of comb electrode fingers 11*a* and 11*b* and a center of a reflective electrode finger closest to the IDT electrode 11 among the plurality of reflective electrode fingers 12*a* is set as an IDT-reflector gap. An inter-center distance in the acoustic wave propagation direction between electrode fingers adjacent to each other in the acoustic wave propagation direction among the electrode fingers of each of the plurality of comb electrode fingers 11*a* and 11*b* and the plurality of reflective electrode fingers 12*a* is set as a pitch. When a comb electrode finger closest to the reflector 12 among the plurality of comb electrode fingers 11*a* and 11*b* is set as a first end-side electrode finger, comb electrode fingers in a direction from the first end-side electrode finger toward a center of the IDT electrode 11 are sequentially set as an n-th end-side electrode finger (n is a natural number), and a pitch between the n-th end-side electrode finger and the (n+1)-th end-side electrode finger is set as an n-th end-side pitch. An average value of each pitch of all the comb electrode fingers 11*a* and 11*b* included in the IDT electrode 11 is set as an average IDT pitch $P_{IDT}$, and an average value of each pitch of all the reflective electrode fingers 12*a* included in the reflector 12 is set as an average reflector pitch $P_{REF}$. In a case where a ratio of the n-th end-side pitch to the average IDT pitch $P_{IDT}$ is set as a variable represented by x, and a ratio of the IDT-reflector gap to the average reflector pitch $P_{REF}$ is set as a variable represented by y, each of the ratio of the n-th end-side pitch and the ratio of the IDT-reflector gap is a value in the region A1 (see FIG. 11) surrounded by a curve defined by (Formula 1) and a curve defined by (Formula 2)

$$y=(59.084x^3-148.85x^2+122.38x-32.175)\times2 \qquad \text{(Formula 1)}$$

$$y=(73.168x^3-193.95x^2+168.75x-47.552)\times2 \qquad \text{(Formula 2)}.$$

In this manner, by setting each of the ratio of the n-th end-side pitch to the average IDT pitch $P_{IDT}$ and the ratio of the IDT-reflector gap to the average reflector pitch $P_{REF}$ to be a value within the region A1 surrounded by (Formula 1) and (Formula 2), the ripple generated on the low-frequency side of the resonant frequency of the acoustic wave element 10 can be reduced or prevented.

Further, each of the ratio of the n-th end-side pitch and the ratio of the IDT-reflector gap may further be a value in the region A2 surrounded by a curve defined by (Formula 3) and a curve defined by (Formula 4)

$$y=(94.697x^3-240.91x^2+201.48x-54.749)\times2 \qquad \text{(Formula 3)}$$

$$y=(142.05x^3-373.86x^2+325.08x-92.761)\times2 \qquad \text{(Formula 4)}.$$

In this manner, by setting each of the ratio of the n-th end-side pitch and the ratio of the IDT-reflector gap to be a value within the region A2 surrounded by (Formula 3) and (Formula 4), the ripple generated on the low-frequency side of the resonant frequency of the acoustic wave element 10 can be reduced or prevented.

Further, n of the n-th end-side electrode finger may be equal to or more than 6 and equal to or less than 10.

According to this, the pitch of the electrode finger from the sixth end-side electrode finger to the tenth end-side electrode finger is set in the range surrounded by (Formula 1) and (Formula 2), and the ripple generated on the low-frequency side of the resonant frequency of the acoustic wave element 10 can be reduced or prevented.

In addition, the pitch of the comb electrode fingers that are 11 or less in number and adjacent to each other in the acoustic wave propagation direction with the eighth end-side electrode finger as a center among the n-th end-side electrode fingers may be about 0.90 times or more and about 0.9909 times or less of the average value of the pitches of the remaining comb electrode fingers obtained by excluding the comb electrode fingers that are 11 or less in number from the plurality of comb electrode fingers 11*a* and 11*b*.

With the above configuration, the ripple generated on the low-frequency side of the resonant frequency of the acoustic wave element 10 can be reduced or prevented.

Further, among the pitches of the comb electrode fingers 11*a* and 11*b*, adjacent pitches in the acoustic wave propagation direction may be irregularly increased and decreased.

In this manner, since the adjacent pitches are irregularly increased and decreased, a ripple generated on the low-frequency side of the resonant frequency of the acoustic wave element 10 can be reduced or prevented.

The acoustic wave filter device 1 according to the present example embodiment includes the acoustic wave element 10 described above.

According to this, it is possible to provide the acoustic wave filter device 1 including the acoustic wave element 10 in which a ripple generated on the low-frequency side of the resonant frequency is reduced or prevented.

Further, the acoustic wave filter device 1 further includes the first input and output terminal 50 and the second input and output terminal 60, and the parallel arm resonators P1 to P4 connected to a node on a path connecting the first input and output terminal 50 and the second input and output terminal 60 and to a ground, and the acoustic wave element 10 may be the series arm resonators S1 to S4 connected between the first input and output terminal 50 and the second input and output terminal 60.

According to the above configuration, the acoustic wave filter device 1 defines a ladder acoustic wave filter including the series arm resonators S1 to S4 and the parallel arm resonators P1 to P4, and the acoustic wave element 10 is applied to the series arm resonators S1 to S4. Therefore, it is possible to reduce or prevent an increase in the insertion loss on the low-frequency side of the resonant frequency of the series arm resonators S1 to S4 defining a pass band of the acoustic wave filter device 1.

The multiplexer 5 according to the present example embodiment includes a plurality of filters including the acoustic wave filter device 1, and one of an input terminal and an output terminal of each of the plurality of filters may be directly or indirectly connected to the common terminal 70, and at least one of the plurality of filters other than the acoustic wave filter device 1 may have a pass band higher than a frequency of the pass band of the acoustic wave filter device 1.

Therefore, in the acoustic wave filter device 1, an attenuation in an attenuation bandwidth on the high-frequency side of the pass band can be enlarged, and thus, an insertion loss within the pass band of the filter having the pass band on the high-frequency side of the pass band of the acoustic wave filter device 1 can be reduced or prevented.

The acoustic wave element 10 according to the present example embodiment includes the piezoelectric substrate 100, the IDT electrode 11 having the pair of comb-shaped electrodes 11A and 11B that oppose each other, and the reflector 12 located adjacent to the IDT electrode 11, which are provided on the piezoelectric substrate 100. Each of the comb-shaped electrodes 11A and 11B defining the pair of comb-shaped electrodes 11A and 11B includes the plurality of comb electrode fingers 11*a* and 11*b* extending in the first direction d1. The reflector 12 includes the plurality of reflective electrode fingers 12*a* extending in the first direction d1, and is located adjacent to the IDT electrode 11 in a second direction d2 that intersects with the first direction d1. In a boundary region between the IDT electrode 11 and the reflector 12, a distance between a center of a comb electrode finger closest to the reflector 12 among the plurality of comb electrode fingers 11*a* and 11*b* and a center of a reflective electrode finger closest to the IDT electrode 11 among the plurality of reflective electrode fingers 12*a* in the second direction d2 is set as an IDT-reflector gap. Among each of the plurality of comb electrode fingers 11*a* and 11*b* and the plurality of reflective electrode fingers 12*a*, an inter-center distance in the second direction d2 between electrode fingers adjacent to each other in the second direction d2 is set as a pitch. When a comb electrode finger closest to the reflector 12 among the plurality of comb electrode fingers 11*a* and 11*b* is set as a first end-side electrode finger, comb electrode fingers in a direction from the first end-side electrode finger toward a center of the IDT electrode 11 are sequentially set as an n-th end-side electrode finger (n is a natural number), and a pitch between the n-th end-side electrode finger and the (n+1)-th end-side electrode finger is set as an n-th end-side pitch. An average value of each pitch of all the comb electrode fingers 11*a* and 11*b* included in the IDT electrode 11 is set as an average IDT pitch $P_{IDT}$, and an average value of each pitch of all the reflective electrode fingers 12*a* included in the reflector 12 is set as an average reflector pitch $P_{REF}$. In a case where a ratio of the n-th end-side pitch to the average IDT pitch $P_{IDT}$ is set as a variable represented by x, and a ratio of the IDT-reflector gap to the average reflector pitch $P_{REF}$ is set as a variable represented by y, each of the ratio of the n-th end-side pitch and the ratio of the IDT-reflector gap is a value in the region A1 surrounded by a curve defined by (Formula 3) and a curve defined by (Formula 2)

$$y=(59.084x^3-148.85x^2+122.38x-32.175)\times2 \qquad \text{(Formula 1)}$$

$$y=(73.168x^3-193.95x^2+168.75x-47.552)\times2 \qquad \text{(Formula 2).}$$

In this manner, by setting each of the ratio of the n-th end-side pitch to the average IDT pitch $P_{IDT}$ and the ratio of the IDT-reflector gap to the average reflector pitch $P_{REF}$ to be a value within the region A1 surrounded by (Formula 1) and (Formula 2), the ripple generated on the low-frequency side of the resonant frequency of the acoustic wave element 10 can be reduced or prevented.

Formulas 1 to 5 do not change if the material and/or structure is as shown in FIGS. 1 and 2 and described in 1.1 Configuration of Acoustic Wave Element of this specification.

However, the range of n of the n-th end-side electrode finger in which the amount of degradation for about 5 MHz can be about 1.0 dB or less varies depending on the configuration of the acoustic wave element.

When the configuration of the acoustic wave element is changed, among the resonance characteristics, the difference between the resonance frequency (fr) and the anti-resonance frequency (fa) and the difference between the resonance frequency (fr) and the minimum frequency at which the stopband ripple occurs (fsbmin) change.

When the configuration of the acoustic wave element is changed, the range of n of the n-th end-side electrode finger in which the amount of degradation for about 5 MHz can be about 1.0 dB or less is the range obtained by rounding the value of N determined by Formula 6 (where n≥2).

$$N=-2.1z+11.2\pm2 \qquad \text{(Formula 6)}$$

$$z=(fsbmin-fr)/(fa-fr) \qquad \text{(Formula 7)}$$

Other Example Embodiments or Like

Although the acoustic wave elements, the acoustic wave filter devices, and the multiplexers according to the example embodiments of the present invention are described above by using the example embodiments and the examples, the acoustic wave elements, the acoustic wave filter devices, and the multiplexers of the present invention are not limited to the example embodiments and examples described above. Other example embodiments that are provided by combining any component in the example embodiments and examples described above, other example embodiments obtained by executing various modifications thought by a person skilled in the art on the example embodiment described above within a range that does not deviate from the gist of the present invention, or various types of equipment having the acoustic wave element, the acoustic wave filter device, and the multiplexer of the present invention therein.

For example, the acoustic wave filter device 1 according to an example embodiment of the present invention may further include a circuit element such as an inductor or a capacitor, for example.

Further, in some cases, an acoustic wave element according to an example embodiment of the present invention is not the surface acoustic wave resonator as in Example Embodiment 1, and may be an acoustic wave resonator using a boundary acoustic wave, for example.

INDUSTRIAL APPLICABILITY

Example embodiments of the present invention can be widely used in communication equipment such as a mobile phone, as a low-loss and small acoustic wave element, an acoustic wave filter device, and a multiplexer that can be applied to multi-band and multi-mode frequency standards.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave element comprising:
a piezoelectric substrate;
an interdigital transducer (IDT) electrode on the piezoelectric substrate and including a pair of comb-shaped electrodes that oppose each other; and
a reflector located adjacent to the IDT electrode in an acoustic wave propagation direction; wherein
each comb-shaped electrode defining the pair of comb-shaped electrodes includes a plurality of comb electrode fingers extending in a direction that intersects with the acoustic wave propagation direction;
the reflector includes a plurality of reflective electrode fingers extending in the direction that intersects with the acoustic wave propagation direction;
in a boundary region between the IDT electrode and the reflector, a distance in the acoustic wave propagation direction between a center of a comb electrode finger closest to the reflector among the plurality of comb electrode fingers and a center of a reflective electrode finger closest to the IDT electrode among the plurality of reflective electrode fingers is set as an IDT-reflector gap;

an inter-center distance in the acoustic wave propagation direction between electrode fingers adjacent to each other in the acoustic wave propagation direction among the electrode fingers of each of the plurality of comb electrode fingers and the plurality of reflective electrode fingers is set as a pitch;

the comb electrode finger closest to the reflector among the plurality of comb electrode fingers is set as a first end-side electrode finger;

the comb electrode fingers in a direction from the first end-side electrode finger toward a center of the IDT electrode are sequentially set as an n-th end-side electrode finger (n is a natural number);

a pitch between the n-th end-side electrode finger and an (n+1)-th end-side electrode finger is set as an n-th end-side pitch;

an average value of each pitch by all of the comb electrode fingers included in the IDT electrode is set as an average IDT pitch;

an average value of each pitch by all of the reflective electrode fingers included in the reflector is set as an average reflector pitch;

a ratio of the n-th end-side pitch to the average IDT pitch is set as a variable represented by x;

a ratio of the IDT-reflector gap to the average reflector pitch is set as a variable represented by y;

n of the n-th end-side electrode finger is equal to or more than 6 and equal to or less than 10; and each of the ratio of the n-th end-side pitch and the ratio of the IDT-reflector gap is a value in a region surrounded by a curve defined by (Formula 1) and a curve defined by (Formula 2)

$$y=(59.084x^3-148.85x^2+122.38x-32.175)\times2 \qquad \text{(Formula 1)}$$

$$y=(73.168x^3-193.95x^2+168.75x-47.552)\times2 \qquad \text{(Formula 2)}.$$

2. An acoustic wave filter device comprising:
the acoustic wave element according to claim 1.

3. The acoustic wave filter device according to claim 2, further comprising:

a first input and output terminal and a second input and output terminal; and a parallel arm resonator connected to a node on a path connecting the first input and output terminal and the second input and output terminal and to a ground; wherein the acoustic wave element is a series arm resonator connected between the first input and output terminal and the second input and output terminal.

4. A multiplexer comprising:

a plurality of filters including the acoustic wave filter device according to claim 3; wherein one of an input terminal and an output terminal of each of the plurality of filters is directly or indirectly connected to a common terminal; and at least one of the plurality of filters except for the acoustic wave filter device has a pass band higher than a frequency of a pass band of the acoustic wave filter device.

5. The multiplexer of claim 4, further comprising an antenna connected to the common terminal.

6. The acoustic wave element according to claim 1, wherein the IDT electrode and the reflector both have a stack structure including a close contact layer and a main electrode layer.

7. The acoustic wave element according to claim 6, wherein the stack structure is covered with a protective film including an oxide component.

8. The acoustic wave element according to claim 1, wherein each of the ratio of the n-th end-side pitch and the ratio of the IDT-reflector gap is further a value in a region surrounded by a curve defined by (Formula 3) and a curve defined by (Formula 4)

$$y=(94.697x^3-240.91x^2+201.48x-54.749)\times2 \qquad \text{(Formula 3)}$$

$$y=(142.05x^3-373.86x^2+325.08x-92.761)\times2 \qquad \text{(Formula 4)}.$$

9. The acoustic wave element according to claim 1, wherein a pitch of the comb electrode fingers that are 11 or less in number and adjacent to each other in the acoustic wave propagation direction with an eighth end-side electrode finger as a center among n-th end-side electrode fingers, each of which being the n-th end-side electrode finger, is about 0.90 times or more and about 0.9909 times or less of an average value of pitches of remaining comb electrode fingers excluding the comb electrode fingers that are 11 or less in number from the plurality of comb electrode fingers.

10. The acoustic wave element according to claim 1, wherein among pitches of the comb electrode fingers, adjacent pitches in the acoustic wave propagation direction are irregularly increased and decreased.

11. The acoustic wave element according to claim 1, wherein the piezoelectric substrate includes a high velocity support substrate, a low velocity film, and a piezoelectric body layer; and the high velocity support substrate, the low velocity film, and the piezoelectric body layer are stacked in this order.

12. An acoustic wave element comprising:

a piezoelectric substrate;

an interdigital transducer (IDT) electrode on the piezoelectric substrate and including a pair of comb-shaped electrodes that oppose each other; and a reflector located adjacent to the IDT electrode; wherein each comb-shaped electrode defining the pair of comb-shaped electrodes includes a plurality of comb electrode fingers extending in a first direction;

the reflector includes a plurality of reflective electrode fingers extending in the first direction, and is located adjacent to the IDT electrode in a second direction that intersects with the first direction;

in a boundary region between the IDT electrode and the reflector, a distance in the second direction between a center of a comb electrode finger closest to the reflector among the plurality of comb electrode fingers and a center of a reflective electrode finger closest to the IDT electrode among the plurality of reflective electrode fingers is set as an IDT-reflector gap;

an inter-center distance in the second direction between electrode fingers adjacent to each other in the second direction among the electrode fingers of each of the plurality of comb electrode fingers and the plurality of reflective electrode fingers is set as a pitch;

the comb electrode finger closest to the reflector among the plurality of comb electrode fingers is set as a first end-side electrode finger;

the comb electrode fingers in a direction from the first end-side electrode finger toward a center of the IDT electrode are sequentially set as an n-th end-side electrode finger (n is a natural number);

a pitch between the n-th end-side electrode finger and an (n+1)-th end-side electrode finger is set as an n-th end-side pitch;

an average value of each pitch by all of the comb electrode fingers included in the IDT electrode is set as an average IDT pitch;

an average value of each pitch by all of the reflective electrode fingers included in the reflector is set as an average reflector pitch;

a ratio of the n-th end-side pitch to the average IDT pitch is set as a variable represented by x;

a ratio of the IDT-reflector gap to the average reflector pitch is set as a variable represented by y;

n of the n-th end-side electrode finger is equal to or more than 6 and equal to or less than 10; and each of the ratio of the n-th end-side pitch and the ratio of the IDT-reflector gap is a value in a region surrounded by a curve defined by (Formula 1) and a curve defined by (Formula 2)

$$y=(59.084x^3-148.85x^2+122.38x-32.175)\times^2 \qquad \text{(Formula 1)}$$

$$y=(73.168x^3-193.95x^2+168.75x-47.552)\times2 \qquad \text{(Formula 2)}.$$

13. The acoustic wave element according to claim 12, wherein the IDT electrode and the reflector both include a stack structure of a close contact layer and a main electrode layer.

14. The acoustic wave element according to claim 13, wherein the stack structure is covered with a protective film including an oxide component.

15. The acoustic wave element according to claim 12, wherein the piezoelectric substrate includes a high velocity support substrate, a low velocity film, and a piezoelectric body layer; and the high velocity support substrate, the low velocity film, and the piezoelectric body layer are stacked in this order.

16. An acoustic wave element comprising:

a piezoelectric substrate;

an interdigital transducer (IDT) electrode on the piezoelectric substrate and including a pair of comb-shaped electrodes that oppose each other; and a reflector located adjacent to the IDT electrode; wherein each comb-shaped electrode defining the pair of comb-shaped electrodes includes a plurality of comb electrode fingers extending in a first direction;

the reflector includes a plurality of reflective electrode fingers extending in the first direction, and is located adjacent to the IDT electrode in a second direction that intersects with the first direction;

in a boundary region between the IDT electrode and the reflector, a distance in the second direction between a center of a comb electrode finger closest to the reflector among the plurality of comb electrode fingers and a center of a reflective electrode finger closest to the IDT electrode among the plurality of reflective electrode fingers is set as an IDT-reflector gap;

an inter-center distance in the second direction between electrode fingers adjacent to each other in the second direction among the electrode fingers of each of the plurality of comb electrode fingers and the plurality of reflective electrode fingers is set as a pitch;

the comb electrode finger closest to the reflector among the plurality of comb electrode fingers is set as a first end-side electrode finger;

the comb electrode fingers in a direction from the first end-side electrode finger toward a center of the IDT electrode are sequentially set as an n-th end-side electrode finger (n is a natural number);

a pitch between the n-th end-side electrode finger and an (n+1)-th end-side electrode finger is set as an n-th end-side pitch;

an average value of each pitch by all of the comb electrode fingers included in the IDT electrode is set as an average IDT pitch;

an average value of each pitch by all of the reflective electrode fingers included in the reflector is set as an average reflector pitch;

a ratio of the n-th end-side pitch to the average IDT pitch is set as a variable represented by x;

a ratio of the IDT-reflector gap to the average reflector pitch is set as a variable represented by y;

n of the n-th end-side electrode finger is equal to or more than 5 and equal to or less than 11; and each of the ratio of the n-th end-side pitch and the ratio of the IDT-reflector gap is a value in a region surrounded by a curve defined by (Formula 1) and a curve defined by (Formula 2)

$$y=(59.084x^3-148.85x^2+122.38x-32.175)\times^2 \qquad \text{(Formula 1)}$$

$$y=(73.168x^3-193.95x^2+168.75x-47.552)\times2 \qquad \text{(Formula 2)}.$$

17. An acoustic wave element comprising:

a piezoelectric substrate;

an interdigital transducer (IDT) electrode on the piezoelectric substrate and including a pair of comb-shaped electrodes that oppose each other; and a reflector located adjacent to the IDT electrode in an acoustic wave propagation direction; wherein each comb-shaped electrode defining the pair of comb-shaped electrodes includes a plurality of comb electrode fingers extending in a direction that intersects with the acoustic wave propagation direction;

the reflector includes a plurality of reflective electrode fingers extending in the direction that intersects with the acoustic wave propagation direction;

in a boundary region between the IDT electrode and the reflector, a distance in the acoustic wave propagation direction between a center of a comb electrode finger closest to the reflector among the plurality of comb electrode fingers and a center of a reflective electrode finger closest to the IDT electrode among the plurality of reflective electrode fingers is set as an IDT-reflector gap;

an inter-center distance in the acoustic wave propagation direction between electrode fingers adjacent to each other in the acoustic wave propagation direction among the electrode fingers of each of the plurality of comb electrode fingers and the plurality of reflective electrode fingers is set as a pitch;

the comb electrode finger closest to the reflector among the plurality of comb electrode fingers is set as a first end-side electrode finger;

the comb electrode fingers in a direction from the first end-side electrode finger toward a center of the IDT electrode are sequentially set as an n-th end-side electrode finger (n is a natural number);

a pitch between the n-th end-side electrode finger and an (n+1)-th end-side electrode finger is set as an n-th end-side pitch;

an average value of each pitch by all of the comb
electrode fingers included in the IDT electrode is set as
an average IDT pitch;

an average value of each pitch by all of the reflective
electrode fingers included in the reflector is set as an
average reflector pitch;

a ratio of the n-th end-side pitch to the average IDT pitch
is set as a variable represented by x;

a ratio of the IDT-reflector gap to the average reflector
pitch is set as a variable represented by y;

n of the n-th end-side electrode finger is equal to or more
than 5 and equal to or less than 11; and each of the ratio of the n-th end-side pitch and the ratio of
the IDT-reflector gap is a value in a region surrounded
by a curve defined by (Formula 1) and a curve defined
by (Formula 2)

$$y=(59.084x^3-148.85x^2+122.38x-32.175)\times^2 \quad \text{(Formula 1)}$$

$$y=(73.168x^3-193.95x^2+168.75x-47.552)\times2 \quad \text{(Formula 2).}$$

* * * * *